(12) United States Patent
Shimizu et al.

(10) Patent No.: US 10,735,673 B2
(45) Date of Patent: Aug. 4, 2020

(54) IMAGING DEVICE MODULE, IMAGING SYSTEM, IMAGING DEVICE PACKAGE, AND MANUFACTURING METHOD

(71) Applicant: CANON KABUSHIKI KAISHA, Tokyo (JP)

(72) Inventors: Koichi Shimizu, Fujisawa (JP); Tadashi Kosaka, Oita (JP); Shuichi Chiba, Kawasaki (JP); Kazuya Notsu, Yokohama (JP); Hisatane Komori, Ayase (JP); Satoru Hamasaki, Fujisawa (JP); Yu Katase, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/389,218

(22) Filed: Apr. 19, 2019

(65) Prior Publication Data

US 2019/0335119 A1   Oct. 31, 2019

(30) Foreign Application Priority Data

Apr. 27, 2018   (JP) .................................. 2018-086514

(51) Int. Cl.
   *H04N 5/341*   (2011.01)
   *H04N 5/225*   (2006.01)
   *H01L 27/146*   (2006.01)

(52) U.S. Cl.
   CPC ........ *H04N 5/341* (2013.01); *H01L 27/14603* (2013.01); *H04N 5/2252* (2013.01)

(58) Field of Classification Search
   CPC .... H04N 5/341; H04N 5/2252; H04N 5/2253; H01L 27/14603; H01L 27/14618
   See application file for complete search history.

(56) References Cited

U.S. PATENT DOCUMENTS

| | | |
|---|---|---|
| 9,220,172 B2 | 12/2015 | Tsuduki et al. |
| 9,576,877 B2 | 2/2017 | Suzuki |
| 2009/0046183 A1 | 2/2009 | Nishida et al. |

(Continued)

FOREIGN PATENT DOCUMENTS

| | | |
|---|---|---|
| JP | 2003-101042 A | 4/2003 |
| JP | 2004-349318 A | 12/2004 |

(Continued)

*Primary Examiner* — Hung H Lam
(74) *Attorney, Agent, or Firm* — Venable LLP

(57) ABSTRACT

According to the disclosure, a relationship of Tgp>Tgf, αf1<αPCB1, and (Tgp−To)×αPCB1<(Tgf−To)×αf1+(Tgp−Tgf)×αf2 or a relationship of Tgp<Tgf, αPCB1<αf1, and (Tgf−To)×αf1<(Tgp−To)×αPCB1+(Tgf−Tgp)×αPCB2 is satisfied, where linear expansion coefficients in an in-plane direction of the substrate at a temperature below a glass transition temperature Tgp of the substrate and at a temperature above the glass transition temperature Tgp of the substrate are denoted as αPCB1 and αPCB2, respectively, linear expansion coefficient of the frame at a temperature below a glass transition temperature Tgf of the frame and at a temperature above the glass transition temperature Tgf of the frame are denoted as αf1 and αf2, respectively, and a room temperature is denoted as To.

15 Claims, 21 Drawing Sheets

(56) References Cited

U.S. PATENT DOCUMENTS

| | | | |
|---|---|---|---|
| 2013/0020692 A1* | 1/2013 | Fujisawa | H01L 23/49582 257/676 |
| 2013/0286565 A1* | 10/2013 | Tsuduki | H01L 23/10 361/679.01 |
| 2014/0008753 A1* | 1/2014 | Tsuduki | H01L 27/14618 257/433 |
| 2014/0339668 A1 | 11/2014 | Arima et al. | |
| 2015/0116975 A1 | 4/2015 | Suzuki | |
| 2018/0076245 A1* | 3/2018 | Ushiyama | H01L 27/14636 |
| 2018/0176428 A1* | 6/2018 | Frohlund | G01B 11/27 |

FOREIGN PATENT DOCUMENTS

| | | | |
|---|---|---|---|
| JP | 2006-303481 A | 11/2006 |
| JP | 2010-251563 A | 11/2010 |
| JP | 2013-243339 A | 12/2013 |
| JP | 2015-15529 A | 1/2015 |
| JP | 2015-84378 A | 4/2015 |
| JP | 2015-185763 A | 10/2015 |
| JP | 6176118 B2 | 8/2017 |
| JP | 2017-188621 A | 10/2017 |

* cited by examiner

FIG. 10A
Tm
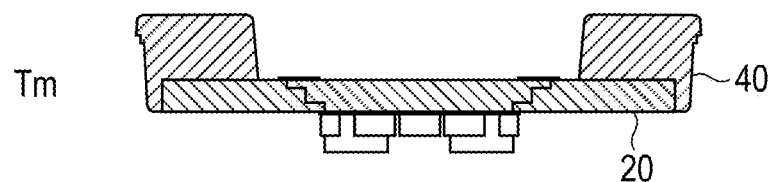
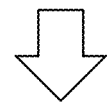
FIG. 10B
Tc
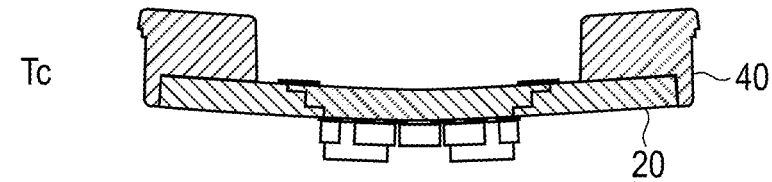
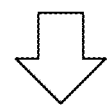
FIG. 10C
To
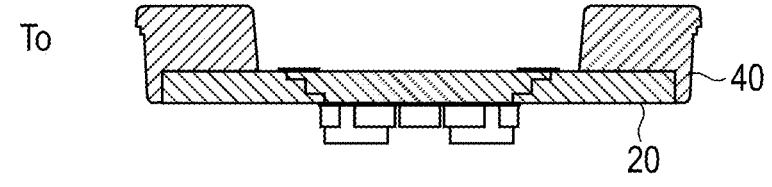

Ta

Tc

To

HIGH TEMPERATURE:T2

HIGH TEMPERATURE:T2

HIGH TEMPERATURE:T2

FIG. 14A

| SAMPLE | SOLID STATE IMAGING DEVICE | | PRINTED BOARD | | | RESIN FRAME | | | | | LIGHT TRANSMITTING MEMBER | (Tgp − To) ×αPCB1 | (Tgf − To)×αf1+ (Tgp − Tgf)×αf2 |
|---|---|---|---|---|---|---|---|---|---|---|---|---|---|
| | αc [ppm/°C] | ADHESIVE AGENT | | αPCB1 [ppm/°C] | αPCB2 [ppm/°C] | FIXING METHOD | FIXING TEMP-ERATURE [°C] | Tgf [°C] | αf1 [ppm/°C] | αf2 [ppm/°C] | αL [ppm/°C] | | |
| EXAMPLE 1 | 3 | RUBBER ELASTICITY | 220 | 10 | 20 | MOLD | 150 | 140 | 9 | 30 | 13 | 1950 | 3435 |
| EXAMPLE 2 | 3 | RUBBER ELASTICITY | 190 | 12 | 28 | MOLD | 150 | 140 | 9 | 30 | 13 | 1980 | 2535 |
| EXAMPLE 3 | 3 | RUBBER ELASTICITY | 220 | 10 | 20 | MOLD | 150 | 140 | 9 | 30 | 7 | 1950 | 3435 |
| EXAMPLE 4 | 3 | RUBBER ELASTICITY | 190 | 12 | 28 | MOLD | 150 | 140 | 9 | 30 | 7 | 1980 | 2535 |
| EXAMPLE 5 | 3 | NON-RUBBER ELASTICITY | 220 | 10 | 20 | MOLD | 150 | 140 | 9 | 30 | 13 | 1950 | 3435 |
| EXAMPLE 6 | 3 | NON-RUBBER ELASTICITY | 190 | 12 | 28 | MOLD | 150 | 140 | 9 | 30 | 13 | 1980 | 2535 |
| COMPARATIVE EXAMPLE1 | 3 | RUBBER ELASTICITY | 250 | 5 | 10 | MOLD | 150 | 140 | 9 | 30 | 13 | 1125 | 4335 |
| COMPARATIVE EXAMPLE2 | 3 | RUBBER ELASTICITY | 160 | 16 | 36 | MOLD | 150 | 140 | 9 | 30 | 13 | 2160 | 1635 |
| COMPARATIVE EXAMPLE3 | 3 | RUBBER ELASTICITY | 250 | 5 | 10 | MOLD | 150 | 140 | 9 | 30 | 7 | 1125 | 4335 |
| COMPARATIVE EXAMPLE4 | 3 | RUBBER ELASTICITY | 160 | 16 | 36 | MOLD | 150 | 140 | 9 | 30 | 7 | 2160 | 1635 |
| COMPARATIVE EXAMPLE5 | 3 | NON-RUBBER ELASTICITY | 250 | 5 | 10 | MOLD | 150 | 140 | 9 | 30 | 13 | 1125 | 4335 |
| COMPARATIVE EXAMPLE6 | 3 | NON-RUBBER ELASTICITY | 160 | 16 | 36 | MOLD | 150 | 140 | 9 | 30 | 13 | 2160 | 1635 |

FIG. 14B

| SAMPLE | DIE-ATTACH FACE WARP AFTER ATTACHMENT OF FRAME [μm] | PACKAGE BACKSIDE FACE WARP AFTER ATTACHMENT OF FRAME [μm] | EVALUATION OF ADSORPTION, TRANSPORTATION | FACE WARP OF IMAGING DEVICE AFTER ADHESION OF IMAGING DEVICE:ROOM TEMPERATURE [μm] | FACE WARP OF IMAGING DEVICE AFTER ADHESION OF LIGHT TRANSMITTING MEMBER: ROOM TEMPERATURE [μm] | FACE WARP OF IMAGING DEVICE AFTER ADHESION OF LIGHT TRANSMITTING MEMBER:-40° [μm] | FACE WARP OF IMAGING DEVICE AFTER ADHESION OF LIGHT TRANSMITTING MEMBER:60° [μm] | EVALUATION OF FACE WARP OF IMAGING DEVICE |
|---|---|---|---|---|---|---|---|---|
| EXAMPLE 1 | −10 | 10 | OK | 10 | 10 | 20 | 0 | OK |
| EXAMPLE 2 | 0 | 0 | OK | 20 | 20 | 30 | 10 | OK |
| EXAMPLE 3 | −10 | 10 | OK | 10 | 10 | 30 | −10 | OK |
| EXAMPLE 4 | 0 | 0 | OK | 20 | 20 | 40 | 0 | OK |
| EXAMPLE 5 | −10 | 10 | OK | 20 | 20 | 30 | 10 | OK |
| EXAMPLE 6 | 0 | 0 | OK | 30 | 30 | 40 | 20 | OK |
| COMPARATIVE EXAMPLE 1 | −100 | 100 | NG | −90 | −90 | −150 | −30 | NG |
| COMPARATIVE EXAMPLE 2 | 110 | −110 | NG | 115 | 115 | 130 | 80 | NG |
| COMPARATIVE EXAMPLE 3 | −100 | 100 | NG | −90 | −90 | −140 | −40 | NG |
| COMPARATIVE EXAMPLE 4 | 110 | −110 | NG | 115 | 115 | 140 | 70 | NG |
| COMPARATIVE EXAMPLE 5 | −100 | 100 | NG | −80 | −80 | −140 | −20 | NG |
| COMPARATIVE EXAMPLE 6 | 110 | −110 | NG | 125 | 125 | 140 | 90 | NG |

FIG. 15A

| SAMPLE | SOLID STATE IMAGING DEVICE | | PRINTED BOARD | | | RESIN FRAME | | | | | | LIGHT TRANSMITTING MEMBER | (Tgf-To) xαf1 | (Tgp-To) xαPCB1+ (Tgf-Tgp) xαPCB2 |
|---|---|---|---|---|---|---|---|---|---|---|---|---|---|---|
| | αc [PPm/°C] | ADHESIVE AGENT | Tgp [°C] | αPCB1 [PPm/°C] | αPCB2 [PPm/°C] | FIXING METHOD | FIXING TEMP-ERATURE [°C] | Tgf [°C] | αf1 [PPm/°C] | αf2 [PPm/°C] | αL [PPm/°C] | | | |
| EXAMPLE 7 | 3 | RUBBER ELASTICITY | 190 | 12 | 28 | ADHESION | 200 | 220 | 13 | 26 | 13 | 2535 | 2820 |
| EXAMPLE 8 | 3 | RUBBER ELASTICITY | 160 | 16 | 36 | ADHESION | 170 | 200 | 18 | 39 | 13 | 3150 | 3600 |
| EXAMPLE 9 | 3 | RUBBER ELASTICITY | 190 | 12 | 28 | ADHESION | 200 | 220 | 13 | 26 | 7 | 2535 | 2820 |
| EXAMPLE 10 | 3 | RUBBER ELASTICITY | 160 | 16 | 36 | ADHESION | 170 | 200 | 18 | 39 | 7 | 3150 | 3600 |
| EXAMPLE 11 | 3 | NON-RUBBER ELASTICITY | 190 | 12 | 28 | ADHESION | 200 | 220 | 13 | 26 | 13 | 2535 | 2820 |
| EXAMPLE 12 | 3 | NON-RUBBER ELASTICITY | 160 | 16 | 36 | ADHESION | 170 | 200 | 18 | 39 | 13 | 3150 | 3600 |
| COMPARATIVE EXAMPLE 7 | 3 | RUBBER ELASTICITY | 190 | 12 | 28 | ADHESION | 200 | 250 | 9 | 30 | 13 | 2025 | 3660 |
| COMPARATIVE EXAMPLE 8 | 3 | RUBBER ELASTICITY | 160 | 16 | 36 | ADHESION | 170 | 180 | 20 | 40 | 13 | 3100 | 2880 |
| COMPARATIVE EXAMPLE 9 | 3 | RUBBER ELASTICITY | 190 | 12 | 28 | ADHESION | 200 | 250 | 9 | 30 | 7 | 2025 | 3660 |
| COMPARATIVE EXAMPLE 10 | 3 | RUBBER ELASTICITY | 160 | 16 | 36 | ADHESION | 170 | 180 | 20 | 40 | 7 | 3100 | 2880 |
| COMPARATIVE EXAMPLE 11 | 3 | NON-RUBBER ELASTICITY | 190 | 12 | 28 | ADHESION | 200 | 250 | 9 | 30 | 13 | 2025 | 3660 |
| COMPARATIVE EXAMPLE 12 | 3 | NON-RUBBER ELASTICITY | 160 | 16 | 36 | ADHESION | 170 | 180 | 20 | 40 | 13 | 3100 | 2880 |

FIG. 15B

| SAMPLE | DIE-ATTACH FACE WARP AFTER ATTACHMENT OF FRAME [μm] | PACKAGE BACKSIDE FACE WARP AFTER ATTACHMENT OF FRAME [μm] | EVALUATION OF ADSORPTION, TRANSPORTATION | FACE WARP OF IMAGING DEVICE AFTER ADHESION OF IMAGING DEVICE: ROOM TEMPERATURE [μm] | FACE WARP OF IMAGING DEVICE AFTER ADHESION OF LIGHT TRANSMITTING MEMBER: ROOM TEMPERATURE [μm] | FACE WARP OF IMAGING DEVICE AFTER ADHESION OF LIGHT TRANSMITTING MEMBER: 40°C [μm] | FACE WARP OF IMAGING DEVICE AFTER ADHESION OF LIGHT TRANSMITTING MEMBER: 60°C [μm] | EVALUATION OF FACE WARP OF IMAGING DEVICE |
|---|---|---|---|---|---|---|---|---|
| EXAMPLE 7 | -15 | 15 | OK | 5 | 5 | 15 | -5 | OK |
| EXAMPLE 8 | -5 | 5 | OK | 15 | 15 | 35 | 5 | OK |
| EXAMPLE 9 | -15 | 15 | OK | 5 | 5 | 35 | -15 | OK |
| EXAMPLE 10 | -5 | 5 | OK | 15 | 15 | 45 | -5 | OK |
| EXAMPLE 11 | -15 | 15 | OK | 15 | 15 | 25 | -5 | OK |
| EXAMPLE 12 | -5 | 5 | OK | 25 | 25 | 45 | 15 | OK |
| COMPARATIVE EXAMPLE 7 | 105 | -105 | NG | 115 | 115 | 160 | 40 | NG |
| COMPARATIVE EXAMPLE 8 | -120 | 120 | NG | -105 | -105 | -170 | -95 | NG |
| COMPARATIVE EXAMPLE 9 | 105 | -105 | NG | 115 | 115 | 170 | 30 | NG |
| COMPARATIVE EXAMPLE 10 | -120 | 120 | NG | -105 | -105 | -190 | -105 | NG |
| COMPARATIVE EXAMPLE 11 | 105 | -105 | NG | 125 | 125 | 170 | 50 | NG |
| COMPARATIVE EXAMPLE 12 | -120 | 120 | NG | -95 | -95 | -160 | -85 | NG |

IMAGING DEVICE MODULE, IMAGING SYSTEM, IMAGING DEVICE PACKAGE, AND MANUFACTURING METHOD

BACKGROUND OF THE INVENTION

Field of the Invention

The present invention relates to an imaging device module, an imaging system, an imaging device package, and a manufacturing method thereof.

Description of the Related Art

An imaging device module in which an electronic component such as a solid state imaging device is sealed inside a hollow package has been proposed. Japanese Patent Application Laid-Open No. 2013-243339 and Japanese Patent Application Laid-Open No. 2015-185763 disclose a solid state imaging device module formed of a substrate, a frame, a solid state imaging device, and a light transmitting member. Further, Japanese Patent Application No. 2013-557430 (Japanese Patent No. 6176118) discloses a solid state imaging device package formed of a substrate and a resin frame molded on the substrate.

In the conventional art described above, however, warp may occur in the substrate due to a difference in a linear expansion coefficient between materials forming the imaging device module, which causes a problem in transportation or adsorptive immobilization of the imaging device module in a manufacturing process of the imaging device module. Further, also after completion of the imaging device module, large warp may occur in the substrate due to a change in the temperature in the usage environment of the imaging device module, which causes a problem of large warp in a light receiving surface of the imaging device.

The present invention intends to provide an imaging device module, an imaging system, an imaging device package, and a manufacturing method of the imaging device module that can suppress deformation due to a change in the temperature.

SUMMARY OF THE INVENTION

According to one embodiment, provided is an imaging device module including: a substrate having a first primary surface, a second primary surface, and an outer edge continuous to the first primary surface and the second primary surface and including a plurality of conductor layers and a plurality of insulating layers; a solid state imaging device attached to the first primary surface; a frame attached to the first primary surface so as to surround a circumference of the solid state imaging device; and a light transmitting member fixed on the frame, and a relationship of $Tgp > Tgf$, $\alpha f1 < \alpha PCB1$, and $(Tgp-To) \times \alpha PCB1 < (Tgf-To) \times \alpha f1 + (Tgp-Tgf) \times \alpha f2$ or a relationship of $Tgp < Tgf$, $\alpha PCB1 < \alpha f1$, and $(Tgf-To) \times \alpha f1 < (Tgp-To) \times \alpha PCB1 + (Tgf-Tgp) \times \alpha PCB2$ is satisfied, where a linear expansion coefficient in an in-plane direction of the substrate at a temperature below a glass transition temperature $Tgp$ of the substrate is denoted as $\alpha PCB1$, a linear expansion coefficient in an in-plane direction of the substrate at a temperature above the glass transition temperature $Tgp$ is denoted as $\alpha PCB2$, a linear expansion coefficient of the frame at a temperature below a glass transition temperature $Tgf$ of the frame is denoted as $\alpha f1$, a linear expansion coefficient of the frame at a temperature above the glass transition temperature $Tgf$ is denoted as $\alpha f2$, and a room temperature is denoted as $To$.

According to another embodiment, provided is an imaging device package including: a substrate having a first primary surface, a second primary surface, and an outer edge continuous to the first primary surface and the second primary surface and including a plurality of conductor layers and a plurality of insulating layers; and a frame attached to the first primary surface, and a relationship of $Tgp > Tgf$, $\alpha f1 < \alpha PCB1$, and $(Tgp-To) \times \alpha PCB1 < (Tgf-To) \times \alpha f1 + (Tgp-Tgf) \times \alpha f2$ or a relationship of $Tgp < Tgf$, $\alpha PCB1 < \alpha f1$, and $(Tgf-To) \times \alpha f1 < (Tgp-To) \times \alpha PCB1 + (Tgf-Tgp) \times \alpha PCB2$ is satisfied, where a linear expansion coefficient in an in-plane direction of the substrate at a temperature below a glass transition temperature $Tgp$ of the substrate is denoted as $\alpha PCB1$, a linear expansion coefficient in an in-plane direction of the substrate at a temperature above the $Tgp$ is denoted as $\alpha PCB2$, a linear expansion coefficient of the frame at a temperature below a glass transition temperature $Tgf$ of the frame is denoted as $\alpha f1$, a linear expansion coefficient of the frame at a temperature above the $Tgf$ is denoted as $\alpha f2$, and a room temperature is denoted as $To$.

According to another embodiment, provided is a manufacturing method of an imaging device module, the manufacturing method including steps of: preparing a substrate having a first primary surface, a second primary surface, and an outer edge continuous to the first primary surface and the second primary surface and including a plurality of conductor layers and a plurality of insulating layers; attaching a solid state imaging device to the first primary surface; attaching a frame to the first primary surface so as to surround a circumference of the solid state imaging device; and attaching a light transmitting member on the frame, and a relationship of $Tgp > Tgf$, $\alpha f1 < \alpha PCB1$, and $(Tgp-To) \times \alpha PCB1 < (Tgf-To) \times \alpha f1 + (Tgp-Tgf) \times \alpha f2$ or a relationship of $Tgp < Tgf$, $\alpha PCB1 < \alpha f1$, and $(Tgf-To) \times \alpha f1 < (Tgp-To) \times \alpha PCB1 + (Tgf-Tgp) \times \alpha PCB2$ is satisfied, where a linear expansion coefficient in an in-plane direction of the substrate at a temperature below a glass transition temperature $Tgp$ of the substrate is denoted as $\alpha PCB1$, a linear expansion coefficient in an in-plane direction of the substrate at a temperature above the glass transition temperature $Tgp$ is denoted as $\alpha PCB2$, a linear expansion coefficient of the frame at a temperature below a glass transition temperature $Tgf$ of the frame is denoted as $\alpha f1$, a linear expansion coefficient of the frame at a temperature above the glass transition temperature $Tgf$ is denoted as $\alpha f2$, and a room temperature is denoted as $To$. The step of attaching the frame to the substrate is performed at a temperature between the glass transition temperature $Tgp$ and the glass transition temperature $Tgf$.

Further features of the present invention will become apparent from the following description of exemplary embodiments with reference to the attached drawings.

BRIEF DESCRIPTION OF THE DRAWINGS

FIG. 10A, FIG. 10B, and FIG. 10C are diagrams illustrating an advantage of the first embodiment.

FIG. 14A is a diagram illustrating an example of the present invention and a comparative example.

FIG. 14B is a diagram illustrating an example of the present invention and a comparative example.

FIG. 15A is a diagram illustrating an example of the present invention and a comparative example.

FIG. 15B is a diagram illustrating an example of the present invention and a comparative example.

DESCRIPTION OF THE EMBODIMENTS

Embodiments of the present invention will be described below with reference to the drawings.

First Embodiment

Figure 1A:
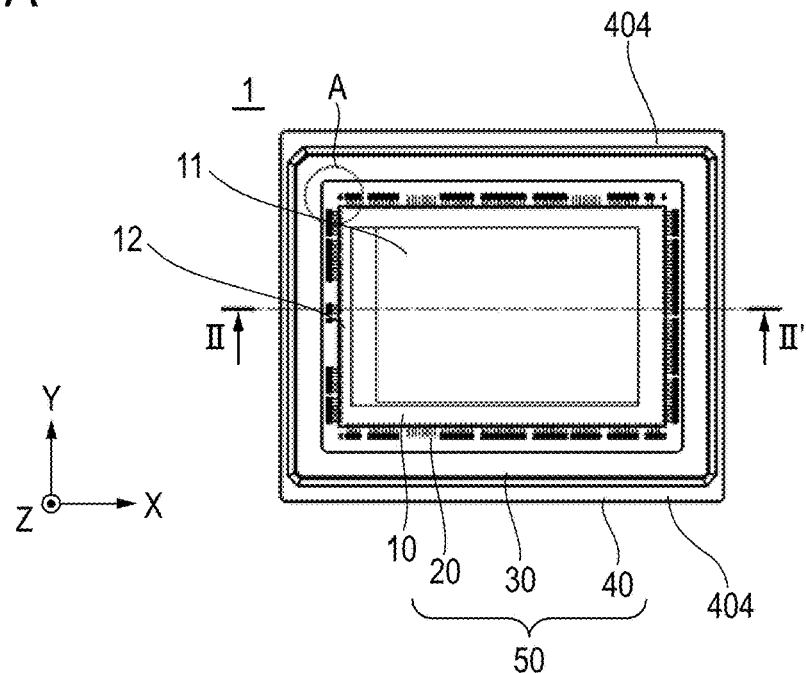
FIG. 1A, FIG. 1B, and FIG. 1C are plan views of an imaging device module according to a first embodiment.
Figure 1B:
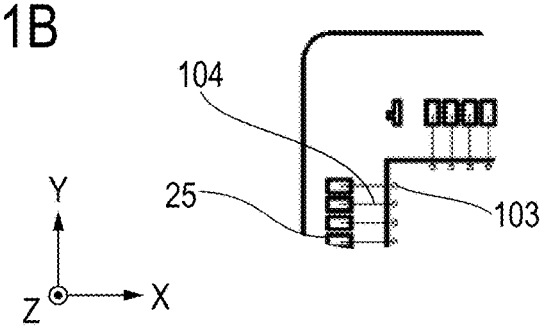
Figure 1C:
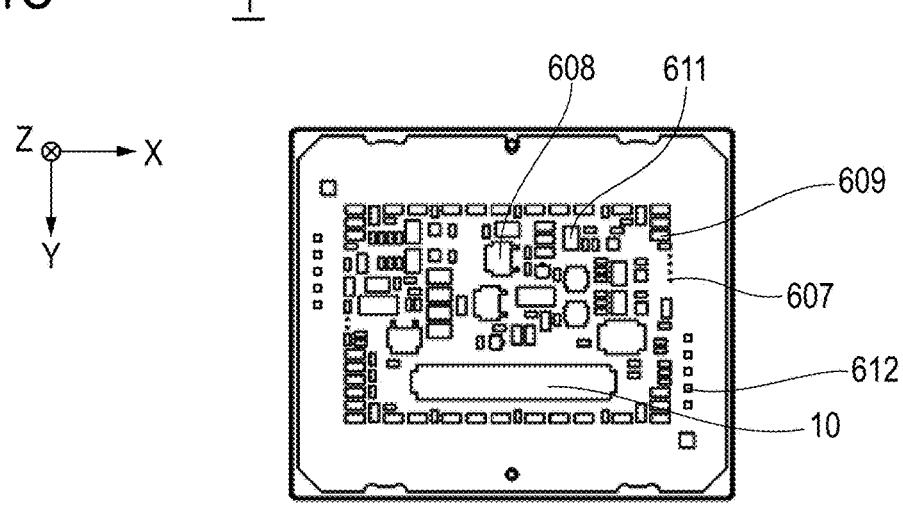
Figure 2A:
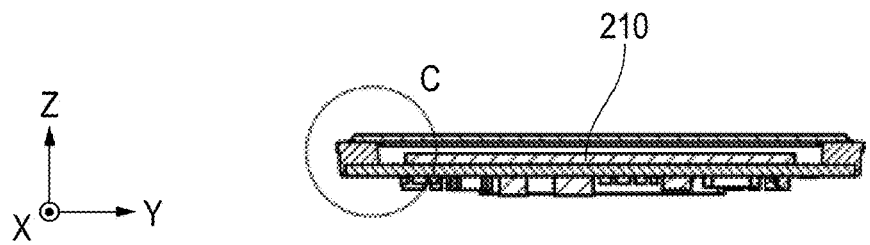
FIG. 2A, FIG. 2B, and FIG. 2C are sectional views of the imaging device module according to the first embodiment.
Figure 2B:
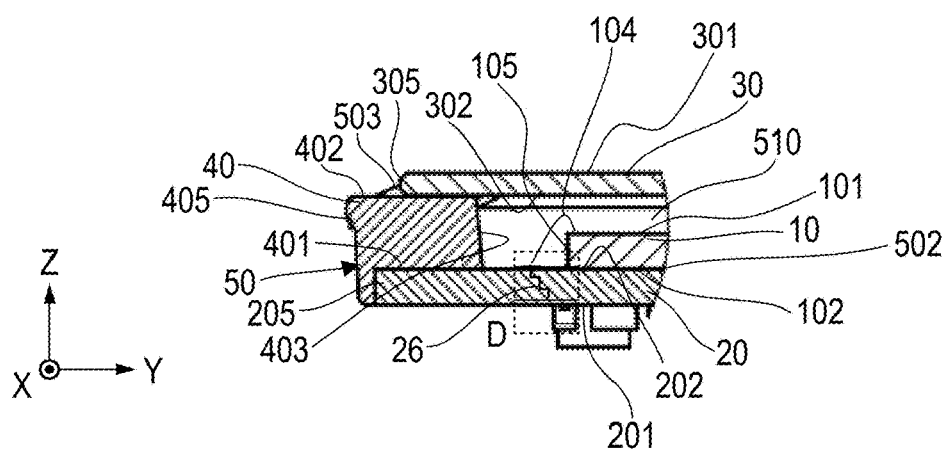
Figure 2C:
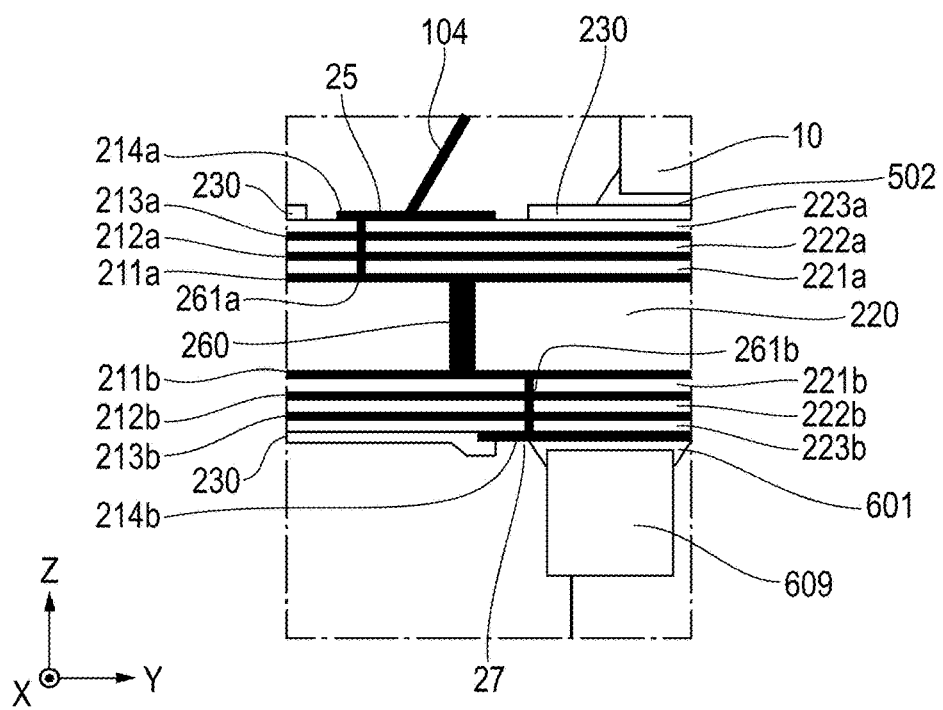

An imaging device module 1 according to a first embodiment of the present invention will be described. FIG. 1A, FIG. 1B, and FIG. 1C are plan views of the imaging device module 1 according to the present embodiment. In particular, FIG. 1A is a plan view of the front side of the imaging device module 1, FIG. 1B is an enlarged view of a portion A, and FIG. 1C is a plan view of the backside of the imaging device module 1. FIG. 2A, FIG. 2B, and FIG. 2C are sectional views of the imaging device module 1 according to the present embodiment. In particular, FIG. 2A is a sectional view of the imaging device module 1 taken along a line II-II' of FIG. 1A, FIG. 2B is an enlarged view of a portion C of FIG. 2A, and FIG. 2C is an enlarged view of a portion D of FIG. 2B. In each drawing, an X-direction, a Y-direction, and a Z-direction are indicated. For the purpose of illustration, description will be provided with the positive direction on the Z-axis being defined as upper and the negative direction on the Z-direction being defined as under.

The imaging device module 1 has a solid state imaging device 10 and an imaging device package 50 accommodating the solid state imaging device 10 therein. The imaging device package 50 mainly includes a printed board 20, a light transmitting member 30, and a resin frame (a frame) 40.

The resin frame 40 has an opening corresponding to the solid state imaging device 10. The light transmitting member 30 may function as an optical member. The solid state imaging device 10 is fixed to the printed board 20. The light transmitting member 30 is fixed to the printed board 20 via the resin frame 40 and surfaces the solid state imaging device 10 via an internal space 510. The resin frame 40 surrounds the internal space 510 between the light transmitting member 30 and the solid state imaging device 10. The internal space 510 described above is formed inside the opening of the resin frame 40.

The positional relationship of members forming the imaging device module 1 may be defined on the X-Y plane. The direction perpendicular to the X-Y plane is here defined as the Z-direction. A front surface 101 of the solid state imaging device 10 and a back surface 102 of the solid state imaging device 10 are parallel to the X-Y plane. Further, as a typical example, an outer surface 301 of the light transmitting member 30 and an inner surface 302 of the light transmitting member 30 are parallel to the X-Y plane. The front surface 101 faces the inner surface 302, and the back surface 102 faces an arrangement region 210 of the printed board 20 and is adhered to the printed board 20.

The typical projection shape of the solid state imaging device 10 and the imaging device module 1 onto the X-Y plane is a rectangle. Further, the dimension of the solid state imaging device 10 in the X-direction is smaller than the size in the Y-direction and the Z-direction and forms substantially a plate-like shape. Hereinafter, the size in the Z-direction is referred to as a thickness or a height for the purpose of illustration.

In the X-direction and the Y-direction, the outer edge of the imaging device module 1 is defined by an outer edge 405 of the resin frame 40 and an outer edge 305 of the light transmitting member 30 and, in a modified example, an outer edge 205 of the printed board 20 in addition. The resin frame 40 has an inner edge 403 in addition to the outer edge 405.

A region of a shade of a member when the member is projected in the Z-direction onto the X-Y plane is referred to as a projection region. When there is one member and the other member different from the one member, the other member being located inside a projection region of the one member means that the one member and the other member are overlapped when viewed from the Z-direction. In contrast, when a part of a projection region of the other member is located outside a projection region of one member, it can be said that at least a part of the other member is located in a region not overlapping the one member. The boundary between the inside and the outside of a projection region corresponds to the outer edge and the inner edge (however, no inner edge may exist) that are contours of the member of interest. For example, since a projection region of the light transmitting member 30 facing the solid state imaging device 10 is included in the projection region of the solid state imaging device 10, the light transmitting member 30 overlaps the solid state imaging device 10.

The solid state imaging device 10 has a primary portion 11 and a secondary portion 12. The primary portion 11 is located at the center of the solid state imaging device 10, and the secondary portion 12 is located around the primary portion 11. The solid state imaging device 10 may be, but not limited thereto, a Charge Coupled Device (CCD) image sensor, a Complementary Metal Oxide Semiconductor (CMOS) image sensor, or the like. The primary portion 11 is an imaging unit and has a plurality of pixels arranged in a matrix. In the solid state imaging device 10, the front surface 101, which is a surface facing the light transmitting member 30, is a light incident surface. The light incident surface can be formed of the outermost layer of a multilayer film provided on a semiconductor substrate having a light receiving surface. The multilayer film includes a layer having an optical function such as a color filter layer, a micro-lens layer, an anti-reflection layer, a light shielding layer, or the like, a planarization layer, a passivation layer, or the like.

The secondary portion 12 has a drive circuit that drives the primary portion 11 and a signal processing circuit that processes a signal from the primary portion 11 or a signal to the primary portion 11. When the solid state imaging device 10 is a CMOS image sensor, it is easy to monolithically form these circuits. Electrodes (electrode pads) 103 used for communicating signals between the solid state imaging device 10 and the outside are provided in the secondary portion 12.

The solid state imaging device 10 is arranged in at least a part of the center region of the printed board 20 and fixed to the printed board 20. Typically, the solid state imaging device 10 is fixed via an adhesive agent 502 arranged between the arrangement region 210 of the printed board 20 and the back surface 102 of the solid state imaging device 10, as illustrated in FIG. 2A to FIG. 2C and FIG. 3A to FIG. 3C. However, the adhesive agent 502 may be in contact with only the outer edge 105, which is the side surface of the solid state imaging device 10, and the inner surface 202 of the printed board 20 and may not be arranged between the arrangement region 210 of the printed board 20 and the back surface 102 of the solid state imaging device 10. The adhesive agent 502 may be conductive or may be insulating. Further, the adhesive agent 502 may preferably have a high thermal conductivity, and an adhesive agent containing metal particles may be used.

Further, when the solid state imaging device 10 is formed on a silicon wafer substrate, in general, a linear expansion coefficient of a silicon wafer is around 3 ppm/degree Celsius, and the difference from the linear expansion coefficient in a planar direction of the printed board 20 is large. Thus, to suppress warp of the solid state imaging device 10, it is preferable to select an adhesive agent having rubber elasticity as the adhesive agent 502. Specifically, a silicone resin is preferable, and the elastic modulus thereof is preferably 1 to 100 MPa. In particular, when the planar sizes in the X-direction and the Y-direction of the solid state imaging device 10 are large, the silicone resin is effective to suppress warp of the solid state imaging device 10 and exhibits a great effect for a solid state imaging device having a size of Advanced Phot System type C (APSC) or larger.

The imaging device package 50 has internal terminals 25 formed on a surface (the inner surface 202 of the printed board 20) on the inner side (on the internal space 510 side) of the imaging device package 50 and external terminals 27 formed on the outer surface (the outer surface 201 of the printed board 20) of the imaging device package 50. A plurality of internal terminals 25 are arranged to form an internal terminal group.

The internal terminals 25 and the external terminals 27 are provided integrally with the printed board 20. In the present example, as illustrated in FIG. 1A, a plurality of internal terminal groups composed of the internal terminals 25 aligned in lines in the X-direction and the Y-direction are arranged so as to surround the solid state imaging device 10.

Without being limited to such an arrangement of the internal terminals 25, an internal terminal group aligned in a line in only the X-direction or in only the Y-direction may be arranged.

Further, a plurality of external terminals 27 form an external terminal group. A plurality of electronic components are connected by solder in a known method to a part or a whole of the external terminal group. Thus, the external terminal group is formed in advance in such an arrangement that corresponds to the shape of these electronic components and a wiring circuit connecting these electronic components to each other. A plating layer suitable for soldering may be formed on the surface of the external terminal group. For example, nickel plating (5 to 10 μm) or gold plating (0.1 to 1 μm) is preferable for a plating layer.

Electronic components are not limited, and various components may be implemented. For example, a power source IC 608, a capacitor 609, a connector 612, a resistor 611, or the like may be employed. In addition, an oscillator circuit component (not illustrated) such as a quartz oscillator, a phase locked loop (PLL) circuit, or the like may be mounted. A component may or may not be mounted on an external terminal 607. A terminal on which no component is mounted may be utilized as a pad with which a probe is contacted in an operation test of the circuit. In particular, to inspect electric characteristics in shipment inspection of the imaging device module 1, it is possible to arrange a pad line 612 used for inspection near the outer edge of the printed board 20.

In the present embodiment, the electrode 103 of the solid state imaging device 10 and the internal terminals 25 of the imaging device package 50 forming the imaging device module 1 are electrically connected to each other via connection conductors 104. Each of the connection conductors 104 is a metal wiring, which may mainly be a gold wiring, an aluminum wiring, a copper wiring, or the like. The connection conductor 104 is connected to the internal terminal 25 by using ultrasonic thermocompression bonding using a wire bonder.

Further, the connection between the electrode 103 and the internal terminal 25 may be flip-chip connection. In such a case, the electrode 103 is provided on the back surface 102 of the solid state imaging device 10, and the internal terminals 25 and the connection conductors 104 are located in the arrangement region 210.

The printed board 20 is a so-called multilayer buildup substrate. As illustrated in the enlarged view of FIG. 2C, the multilayer buildup substrate encloses a double-sided substrate in which conductor layers 211a and 211b are provided on both sides of an insulating layer 220 made of a prepreg used as a core. The conductor layers 211a and 211b are each patterned to a desired pattern by lithography, and each necessary portion is then connected by an internal wiring 260 provided inside a drill via.

Furthermore, an insulating layer 221a and a conductor layer 212a are formed in this order on the upper side of the double-sided substrate, and an insulating layer 221b and a conductor layer 212b are formed in this order on the underside of the double-sided substrate. The conductor layers 212a and 212b are each also patterned to a desired pattern by lithography in a similar manner to the conductor layers 211a and 211b. At this time, each necessary portion is connected to the conductor layers 211a and 211b by the internal wirings 261a and 261b each provided inside a laser via. Then, an insulating layer 222a and a conductor layer 213a are formed, and an insulating layer 222b and a conductor layer 213b are formed in a similar manner. Further, an insulating layer 223a and a conductor layer 214a are formed, and an insulating layer 223b and a conductor layer 214b are formed. The conductor layers 211a to 214a are connected by an internal wiring 261a, the conductor layers 211b to 214b are connected by an internal wiring 261b. The insulating layers 221a to 223a and 221b to 223b are each also made of a pregreg.

The thickness of the insulating layer 220 is approximately 0.05 to 1.5 mm, the thickness of the insulating layers 221a to 223a and insulating layers 221b to 223b is approximately 0.05 to 0.3 mm. While an example where the printed board 20 is a buildup substrate has been illustrated in the present embodiment, the present invention is not limited thereto. For example, the thickness of the insulating layer 220 may have the same thickness as other insulating layers 221a to 223a and 221b to 223b or may be a substrate without a drill via (any-layer substrate).

The pregreg is obtained by impregnating a resin into woven or knit fibers on a cross. Resins whose primary component is epoxy or phenol are widely used. Further, resins often contain an insulating filler such as paper, a glass, or the like. Further, while glass fibers are commonly used as fibers, the fiber is not limited thereto as long as it is insulating.

The internal terminals 25 and the external terminals 27 are formed in the conductor layer 214a on the inner surface (first primary surface) 202 side and in the conductor layer 214b on the outer surface (second primary surface) 201 side, respectively, of the printed board 20 after patterning by lithography. In such a way, the internal terminals 25 and the external terminals 27 are electrically continuous via the internal wirings 26 formed of the internal wirings 260, 261a, and 261b of the printed board 20. The conductor layers 211a to 214a and 211b to 214b are preferably made of copper in general. Other metals may be used if necessary.

In FIG. 2C, the capacitor 609 is connected to the external terminal 27 via solder 601. The length of the connection conductor 104 is substantially the same as the thickness of the solid state imaging device 10, for example, 0.1 to 1 mm. The thickness of the printed board 20 is 0.1 to 1 mm, and when the internal wirings 261a, 261b, and 260 are arranged in a line, the length is approximately 0.1 to 1 mm. That is, the distance from the electrode 103 of the solid state imaging device 10 to the terminal of the capacitor 609 can be approximately 0.2 to 2 mm, and the inductance resulted by this wiring can be suppressed to approximately 0.2 to 2 nH. This numerical value is sufficiently smaller than the wiring inductance resulted when a printed board on which a solid state imaging device is mounted is different from a substrate on which electronic components are mounted as disclosed in Japanese Patent Application Laid-Open No. 2013-243339 and Japanese Patent Application No. 2013-557430 (Japanese Patent No. 6176118).

In the present embodiment, it is preferable that electronic components be arranged such that the electronic components do not overlap the projection region on the outer surface 201 of the internal terminal 25 and the outer surface 201 of the electrode 103. This is because it is necessary to perform wire bonding in a state where a part of a heated metal stage is in contact with the projection region on the outer surface 201 of the internal terminal 25 and the outer surface 201 of the electrode 103 in order to reliably perform ultrasonic thermocompression bonding at a stable temperature.

The printed board 20 may have a recess shape in which the center region is recessed relative to the peripheral region surrounding the center region, that is, a concave shape.

Further, a solder resist layer 230 is formed on the surface as illustrated in FIG. 2C, it is preferable to have a patterned opening, if necessary.

In FIG. 2A to FIG. 2C, the resin frame 40 fully covers the outer edge 205 of the printed board 20. The outer edge 205 forms an end surface that is continuous to the outer surface 201 and the inner surface 202 of the printed board 20 and forms the side surface of the outer circumference of the printed board 20. When the outer edge 205 is formed by general router processing with an end mill, a foreign material made of a glass fiber, a filler, or a resin inside the prepreg forming the printed board is attached to a surface of the outer edge 205. It is difficult to completely remove such a foreign material by washing. In a manufacturing process of the imaging device module 1, when these foreign materials are scattered and attached to the primary portion 11 of the solid state imaging device 10, a defect is highly likely to be determined in electric characteristics inspection, which may cause an undesirable result. Therefore, the resin frame 40 fully covering the outer edge 205 of the printed board 20 is effective to increase yield. Such the resin frame 40 can be made by insert-molding the printed board 20 in a mold in which a predetermined shape of the resin frame 40 is engraved as disclosed in Japanese Patent Application No. 2013-557430 (Japanese Patent No. 6176118). At this time, it is preferable to engrave a clearance portion for the electronic component on the surface of the mold contacted to the outer surface 201 so as to prevent the electronic component from being interfered by the mold and collapsed.

It is preferable that the material of the resin frame 40 have a strength and a morphological stability necessary for an imaging device module. Further, it is preferable that the resin frame 40 include no halogen that affects the solid state imaging device or no substance that solves in water in a long term and transfers to and deposits on the inner surface 302 of the light transmitting member 30 under the usage environment of the imaging device module. For example, a thermoplastic resin such as a polyethylene resin, a polypropylene resin, an ethylene vinyl acetate resin, a polystyrene, an AS resin, an ABS resin, an acrylic resin, a polyvinyl chloride resin, a cellulose based resin, polyacetal, polyamide, polyethylene terephthalate, polybutylene terephthalate, polycarbonate, denatured polyphenyleneether, polyphenylenesulfide, polyetheretherketone, liquid crystal polymer, polysulfone, polyethersulfone, polyallylate, polyamideimide, polyetherimide, polymethylpentene, or the like can also be used. Note that a thermoplastic resin is preferable for stably maintaining the strength and the shape in a wide temperature range between −40 degrees Celsius and 130 degrees Celsius. A phenol resin, a urea resin, a melamine resin, a diallyl phthalate resin, an unsaturated polyester resin, a polyimide resin, a urethane resin, or the like can also be sued as a thermoplastic resin, and a resin whose primary component is an epoxy resin is preferable. In particular, it is preferable to use a resin obtained by mixing an aromatic amine curing agent, a phenol resin curing agent or an acid anhydride curing agent, and a filling material to a bisphenol A or a novolac glycidylether based resin.

A filler containing around 70 to 85% by weight of silica powder, talc, or the like is preferable as a filler because the dimension less changes after molding. Further, it is preferable to include a parting agent or a flame retardant for enhancing parting property from a mold.

Figure 3A:
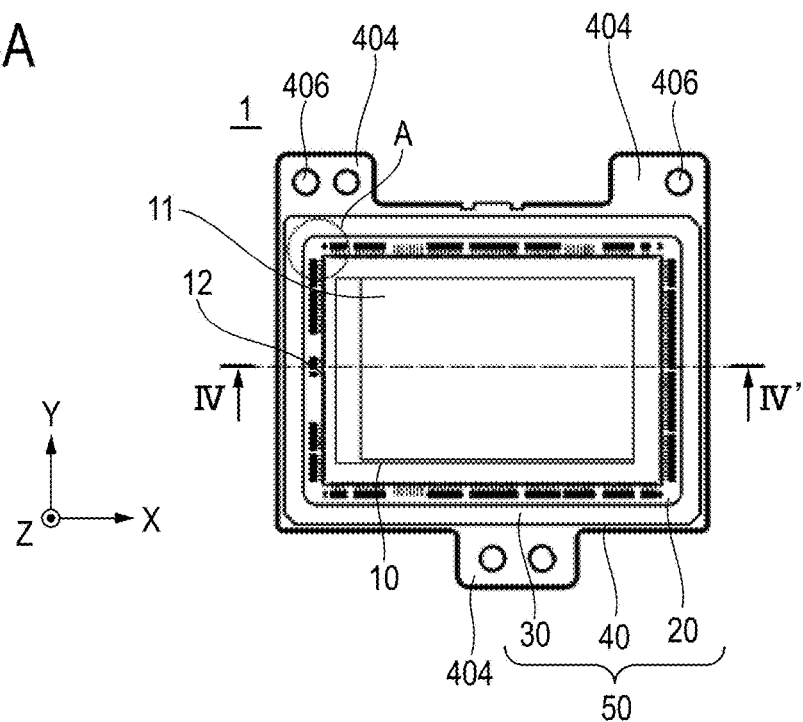
FIG. 3A, FIG. 3B, and FIG. 3C are plan views of an imaging device module according to a modified example of the first embodiment.
Figure 3B:
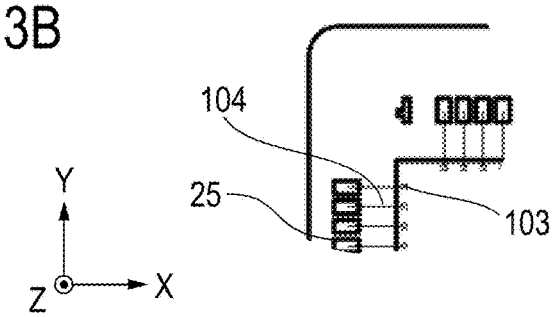
Figure 3C:
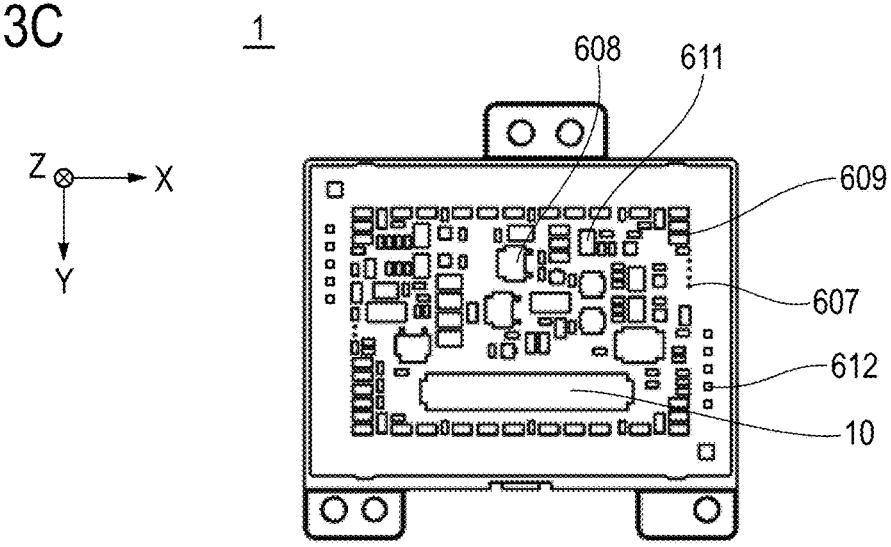

FIG. 3A, FIG. 3B, and FIG. 3C are plan views of the imaging device module 1 as a modified example according to the present embodiment. In particular, FIG. 3A is a plan view of the front side of the imaging device module 1, FIG.

Figure 4A:
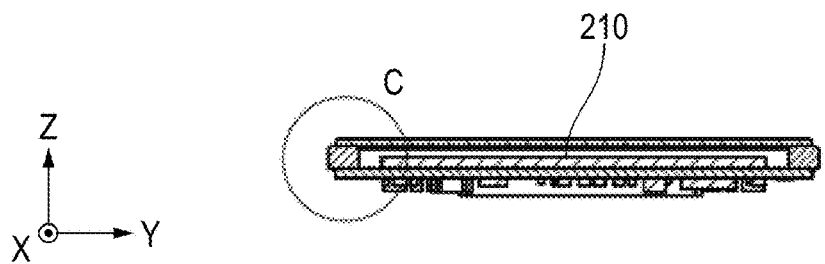
FIG. 4A, FIG. 4B, and FIG. 4C are sectional views of the imaging device module according to the modified example of the first embodiment.
Figure 4B:
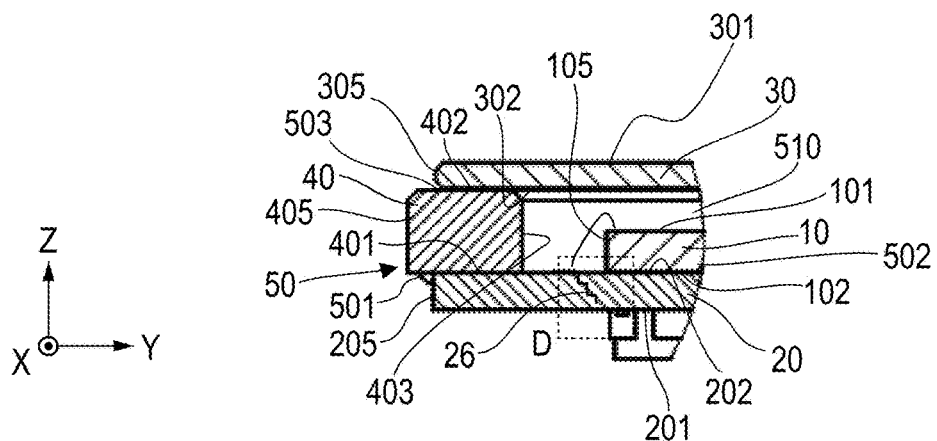
Figure 4C:
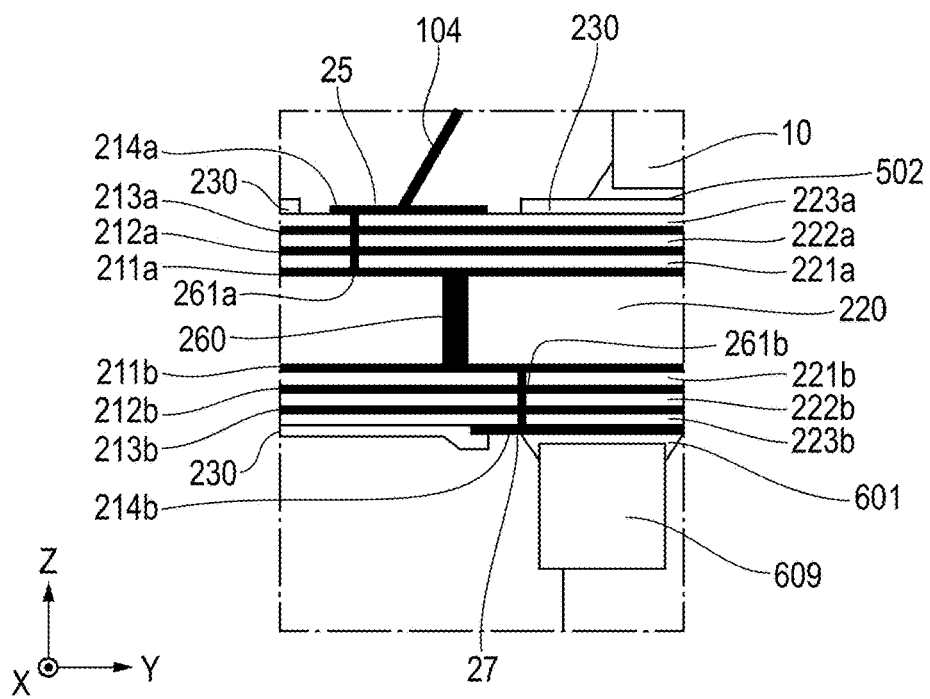

3B is an enlarged view of a portion A, and FIG. 3C is a plan view of the backside of the imaging device module 1. FIG. 4A, FIG. 4B, and FIG. 4C are sectional views of the imaging device module 1 as a modified example according to the present embodiment. In particular, FIG. 4A is a sectional view of the imaging device module 1 taken along a line IV-IV' of FIG. 3A, FIG. 4B is an enlarged view of a portion C of FIG. 4A, and FIG. 4C is an enlarged view of a portion D of FIG. 4B. In each drawing, the X-direction, the Y-direction, and the Z-direction are indicated. The imaging device module 1 as a modified example will be described below with reference to respective drawings with each other in which the same or similar components are labeled with the same reference.

In FIG. 4A, FIG. 4B, and FIG. 4C, the resin frame 40 does not cover the outer edge 205 of the printed board 20. Therefore, when the processing method of the outer edge 205 of the printed board is router processing described above, there is a concern about reduction in yield due to attachment of a foreign material to the primary portion 11 of the solid state imaging device 10. However, it is possible to avoid reduction in yield to some degrees by employing wet dicing for the processing method of the outer edge 205.

Also in the modified example, the same material as described above in the present embodiment can be used. While the molding method of the resin frame may also be a transfer molding that is the same as in the first example, injection molding or compression molding may be used in the case of the present example. In the present example, a member molded with only the resin frame 40 is fixed on the inner surface 202 of the printed board 20 via the adhesive agent 501. It is preferable that a resin used for such adhesive fixation has a strength and a morphological stability necessary for the imaging device module in the same manner as the resin frame 40. Further, it is preferable that the resin frame 40 include no halogen that adversely affects the solid state imaging device or no substance that solves in water in a long term and transfers to and deposits on the inner surface 302 of the light transmitting member 30 under the usage environment of the imaging device module. For example, a thermosetting epoxy resin is preferable, and a moderate amount of a filler, a coupling agent, or a frame retardant may be contained.

Note that, without being limited to the sectional structure of FIG. 2A to FIG. 2C and FIG. 4A to FIG. 4C, the distance between the solid state imaging device 10 and the light transmitting member 30 may be reduced, a frame part may be provided to the light transmitting member 30, or the like, and thereby the resin frame 40 may surround only the solid state imaging device 10 without surrounding the internal space 510. That is, the resin frame 40 may surround at least one of the internal space 510 and the solid state imaging device 10.

The light transmitting member 30 faces the solid state imaging device 10 and has a function of protecting the solid state imaging device 10. The light transmitting member 30 is required to be transparent to a light having a wavelength for which the solid state imaging device 10 has a sensitivity (typically, a visible light). A preferable material for the light transmitting member 30 may be a plastic, a glass, a quartz, or the like. Note that, as described later, when the light transmitting member 30 is attached to the resin frame 40, a quartz can effectively suppress warp of the solid state imaging device 10. Thus, it is preferable to use quartz as the light transmitting member 30. An anti-reflection coating or an infrared cut coating may be formed on the surface of the light transmitting member 30.

The light transmitting member 30 is adhered to the resin frame 40 via the adhesive agent 503. The solid state imaging device 10 and the internal space 510 are located between the center region of the printed board 20 and the center region of the light transmitting member 30. In the present embodiment, the light transmitting member 30 is located more distant from the solid state imaging device 10 and the printed board 20 than the resin frame 40 in the Z-direction, and the adhesive agent 503 is provided on the inner surface 302, which is a surface of the light transmitting member 30 facing the solid state imaging device 10. However, as illustrated in FIG. 3 of Japanese Patent Application Laid-Open No. 2003-101042, a part of the resin frame 40 may be arranged more distant from the solid state imaging device 10 and the printed board 20 than the light transmitting member 30 in the Z-direction, and the adhesive agent 503 may be provided on the outer surface 301 of the light transmitting member 30.

The thickness of the adhesive agents 501, 502, and 503 is 1 to 1000 μm, for example, and may typically be 10 to 100 μm. The resin frame 40 and the printed board 20 are directly joined in the first example, and the resin frame 40 and the printed board 20 are adhered by using the adhesive agent 501 in the modified example. The solid state imaging device 10 and the printed board 20 are adhered by using the adhesive agent 502, the light transmitting member 30 and the resin frame 40 are adhered by using the adhesive agent 503. While the order of such adhesion is not particularly limited, it is preferable that the adhesion of the resin frame 40 and the printed board 20 be performed prior to the adhesion of the light transmitting member 30 and the resin frame 40. Further, it is preferable that the adhesion of the resin frame 40 and the printed board 20 be performed prior to the adhesion between the solid state imaging device 10 and the printed board 20. That is, the resin frame 40 and the printed board 20 are first adhered to each other, and the imaging device package 50 is then formed. After the solid state imaging device 10 is fixed to the imaging device package 50, the light transmitting member 30 is adhered to the imaging device package 50.

It is preferable that the printed board 20 and the resin frame 40 be joined directly or via the adhesive agent 501 at the entire circumference of the junction interface between the printed board 20 and the resin frame 40. Further, it is also preferable that the light transmitting member 30 and the resin frame 40 be joined by the adhesive agent 503 at the entire circumference of the junction interface therebetween. In such a way, with each of the entire circumferences of the peripheral regions of the printed board 20 and the light transmitting member 30 being used as the adhesion region, the internal space 510 around the solid state imaging device 10 can be an airtight space with respect to the external air. As a result, it is possible to suppress entry of a foreign material to the internal space 510 and improve the reliability. Note that it is desirable to use a sufficient amount of the adhesive agent in order to ensure airtightness.

The adhesive agents 501, 502, and 503 described above are resulted after the applied adhesive agents are solidified, respectively. The type of the adhesive agent may be, a dry cure type using evaporation of a solvent, a chemical reaction type cured by polymerization of molecules with light or heat, a thermal fusion (hot melt) type solidified by solidification of a melt adhesive agent, or the like. As a typical adhesive agent, a photo-curing resin cured by an ultraviolet light or a visible light, a thermosetting resin cured by heat, or the like may be used. A thermosetting resin may be preferably used for the adhesive agents 501 and 502, and a photo-curing resin may be preferably used for the adhesive agent 503. Regarding the visual color of adhesive agents, white, black, colorless, or the like may be used without being particularly limited in the case of the thermosetting curing resin. The photo-curing resin is transparent to a visible light or an ultraviolet light. The adhesive agent may moderately contain an inorganic or organic filler. Inclusion of a filler can improve humidity resistance. Without being limited, the elastic modulus of a cured adhesive agent preferably ranges from 1 MPa to 100 GPa when different materials are adhered to each other. However, the elastic modulus is not limited to such a value. As described later, when a large solid state imaging device 10 having an APSC size or a FULL size is used, a use of an adhesive agent having rubber elasticity can reduce an influence of the difference in the linear expansion from the printed board 20. In such a case, furthermore, the elastic modulus is preferably 1 to 100 MPa.

The resin frame 40 has a junction surface 401 facing the printed board 20 and directly adhered to the printed board 20 or adhered to the adhesive agent 501 and a junction surface 402 facing the light transmitting member 30 and adhered to the adhesive agent 503. The resin frame 40 is provided so as to surround the internal space 510 between the solid state imaging device 10 and the light transmitting member 30. In the resin frame 40, a surface facing the internal space 510 and surrounding the internal space 510 is the inner edge 403. The outer edge 405 of the resin frame 40 is exposed to the external space. Each of the resin frames 40 in FIG. 1A to FIG. 1C and FIG. 3A to FIG. 3C has an extension portion 404 extending from a portion between the printed board 20 and the light transmitting member 30 toward the external space in the Y-direction. In the modified example of FIG. 3A to FIG. 3C, a through hole 406 is provided in the extension portion 404 and may be used as a screwing hole used for fixing to a casing of an electronic equipment or the like or a positioning hole. The electronic equipment may be an imaging device such as a still camera, a video camera, or the like, an information terminal having a capturing function, or the like.

To enhance the airtightness of the internal space 510, it is preferable that the resin frame 40 surround the internal space 510 without a gap. Further, to ensure the rigidity of the resin frame 40 and thus the rigidity of the imaging device module 1, it is preferable that the resin frame 40 be a seamless closed loop. Further, as described later, to ensure a thermal conductivity, it is preferable that the resin frame 40 be a closed loop continuous in the circumferential direction. However, the resin frame 40 may be formed as multiple divided parts for each side in accordance with constraint of manufacturing. Further, to allow the internal space 510 to communicate with the external space, a slit may be provided in the resin frame 40. When there is a notch in the resin frame 40 as discussed above, it is desirable that the number of discontinuous parts (slits) occurring in the resin frame 40 be smaller as much as possible and, specifically, occupy less than 10% of the length of the circumferential surrounding the internal space 510 and the solid state imaging device 10. That is, when the resin frame 40 extends along the circumference surrounding the internal space 510 and the solid state imaging device 10 over 90% of the circumferential length thereof, the resin frame 40 may be considered to surround the internal space 510 and the solid state imaging device 10. For example, when the inner edge 403 is a square of 20 mm in vertical and 20 mm in horizontal and therefore the circumferential length of the inner edge 403 is 80 mm, the resin frame 40 may be considered to surround the internal space 510 when the width of a slit provided in the resin frame 40 is less than 8 mm. Also in this case, it is preferable that the width of one slit be smaller. For example, it is more preferable to provide two slits each having a width of 4 mm than to provide one slit having a width of 8 mm.

Since the resin frame 40 and the printed board 20 are attached by using an adhesive agent, the present embodiment is preferable for a case where the material of the resin frame 40 is different from the material of the printed board 20. Further, the present embodiment is preferable for a case where the material of the resin frame 40 is different from the material of the light transmitting member 30.

The resin frame 40 defines the spacing between the solid state imaging device 10 and the light transmitting member 30 and has a function of supporting the light transmitting member 30. Further, the resin frame 40 may have a screwing hole or a positioning hole as described above.

Next, a manufacturing method of the imaging device package 50 and the imaging device module 1 according to the first embodiment will be described. FIG. 5A to FIG. 5G are diagrams illustrating the manufacturing method of the imaging device package 50 and the imaging device module 1 according to the first embodiment, which illustrate cross sections taken along a line II-II' of FIG. 1A.

Figure 5A:
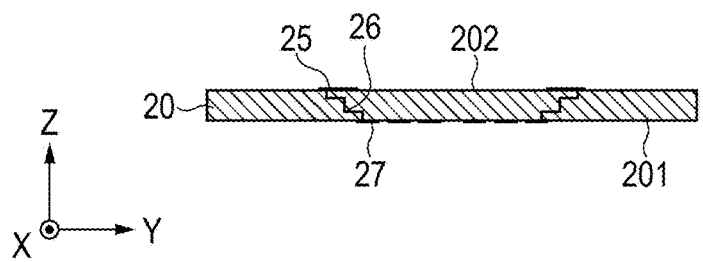
FIG. 5A, FIG. 5B, FIG. 5C, FIG. 5D, FIG. 5E, FIG. 5F, and FIG. 5G are diagrams illustrating a manufacturing method of the imaging device module according to the first embodiment.

In FIG. 5A, first, the printed board 20 is prepared. The internal terminals 25, the internal wirings 26, and the external terminals 27 have already been formed in the printed board 20. The internal terminals 25 are provided on the inner surface 202 of the printed board 20, and the external terminals 27 are provided on the outer surface 201 of the printed board 20. Such the printed board 20 is formed as described below, for example.

The printed board 20 has the sectional structure illustrated in the enlarged view of the portion D of FIG. 2C and is formed by a so-called multilayer buildup substrate method. In the multilayer buildup substrate method, first, the conductor layers 211a and 211b are formed on the both sides of the insulating layer 220 made of a prepreg used as a core, and the double-sided substrate is prepared. Next, a via is formed at a predetermined position by using a drill, the internal wiring 260 is formed by metal plating. Next, the conductor layers 211a and 211b are patterned to a desired pattern by lithography. Thereby, a double-sided substrate is completed.

Furthermore, the insulating layer 221a and the conductor layer 212a are formed in this order on the upper surface of the double-sided substrate, and the insulating layer 221b and the conductor layer 212b are formed in this order on the underside of the double-sided substrate. Subsequently, a via is again formed at a predetermined position by using a laser. Furthermore, the internal wirings 261a and 261b are formed inside the laser via by a plating process, and necessary portions are connected to the conductor layers 211a and 211b. The conductor layers 212a and 212b are also patterned to a desired pattern by lithography in the same manner as the conductor layers 211a and 211b. Then, similarly, the insulating layers 222a and 222b and the conductor layers 213a and 213b are formed, and the insulating layers 223a and 223b and the conductor layers 214a and 214b are formed. Finally, the solder resist layer 230 is formed, and a desired opening is formed by lithography.

Figure 5B:
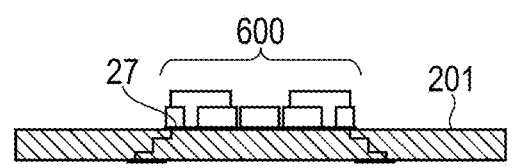

FIG. 5B illustrates a process of mounting the electronic components 600 on the outer surface 201 of the printed board 20. The electronic components 600 are soldered and connected onto the outer surface 201 of the printed board 20 by a surface mounting method. First, a print mask having openings that matches the arrangement of the external terminals 27 provided on the outer surface 201 of the printed board 20 is prepared. Next, the print mask is contacted with the outer surface 201 such that the openings thereof match the external terminals 27. In such a state, solder paste is disposed on the mask, the solder paste is printed on the outer surface 201 by using a squeegee. Next, the desired electronic components 600 are mounted on the outer surface 201 by using a mounter such that the external terminals 27 and respective terminals of the electronic components 600 are matched. The electronic components 600 may include the power source IC 608, the capacitor 609, or the like as described above. The printed board 20 on which the electronic components 600 are mounted passes through a reflow oven, and solder junctions between the external terminals 27 and respective terminals of the electronic components 600 are completed. The flux included in solder paste may cause a reduction in yield when removed from the printed board 20 in a subsequent process and attaching to the solid state imaging device 10. Thus, it is desirable to clean up the flux by using a cleaning machine and a cleaning liquid.

Figure 5C:
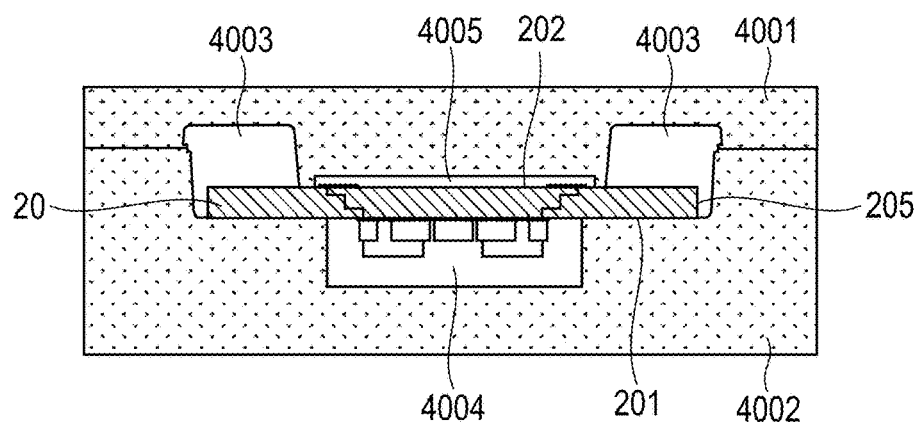
Figure 5D:
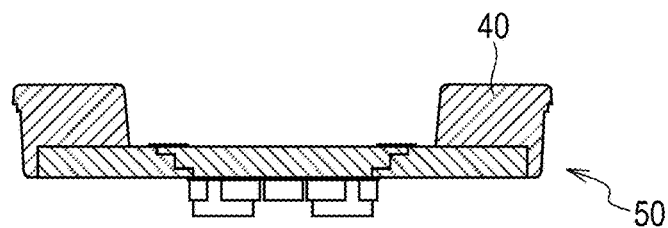

FIG. 5C illustrates a process of inserting the printed board 20 into a mold and molding the resin frame 40. An upper mold 4001 comes into contact with a part of the inner surface 202, a lower mold 4002 comes into contact with near the outer edge 205 of the outer surface 201, and thereby closed spaces 4003, 4004, and 4005 are formed. The closed space 4003 is connected to a gate, a runner, a cull, or a pod (not illustrated). The mold is preheated at a temperature above a glass transition temperature Tgf of the resin frame 40. A resin forming the resin frame 40 is prepared as a tablet solidified in a cylindrical shape in which desired materials such as a primary component, a curing agent, a parting agent, a coupling agent, a flame retardant, or the like are mixed in a powder in advance. The tablet is supplied in the pod described above and press-fit by a pressure being applied to only the closed space 4003 of the mold through a cull, a runner, or a gate. After a curing time period defined by characteristics of a resin has elapsed, the mold is opened, and the imaging device package 50 of FIG. 5D is taken out. The closed space 4004 is provided to prevent the lower mold 4002 from coming into contact with the electronic components 600 and causing damage on the electronic components 600. Further, the closed space 4005 is provided to avoid damage on the internal terminals 25 of the printed board 20. While the present example employs so-called transfer mold, the molding method may be injection molding, compression molding, or the like.

Figure 5E:
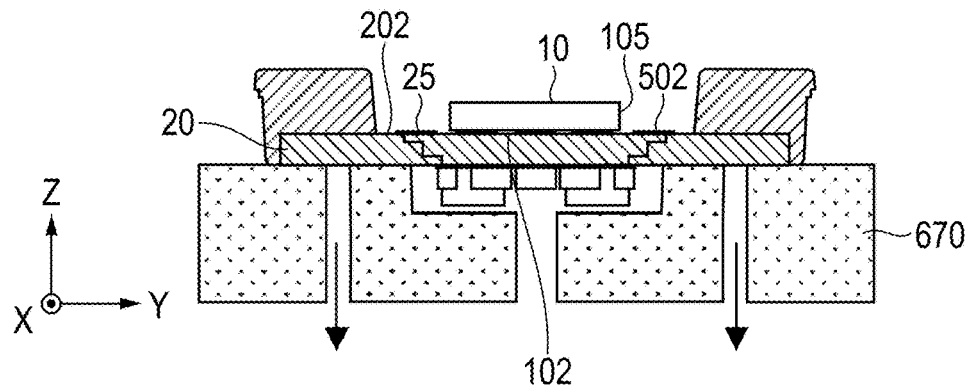

FIG. 5E illustrates a process of fixing the solid state imaging device 10 onto the inner surface 202 of the printed board 20. The adhesive agent 502 is applied to at least one of the inner surface 202 of the printed board 20 and the back surface 102 of the solid state imaging device 10 or typically only the inner surface 202 of the printed board 20. The solid state imaging device 10 is then arranged on the adhesive agent 502. Then the adhesive agent 502 is cured, and the solid state imaging device 10 and the printed board 20 are adhered to each other. It is desirable that the adhesive agent 502 maintain a sufficient adhesive strength under the usage environment of the imaging device module 1. Further, a material which contains a solvent component exhibiting a high wettability, facilitates breed of the solvent component, and contaminates the surface of the internal terminals 25 on the inner surface 202 of the printed board 20 is not preferable for the adhesive agent. Furthermore, a material which contains halogen, exhibits corrosiveness to a semiconductor wiring, has a curing material including a volatile component and solving in dew condensation water occurring on the inner surface 302 of the light transmitting member 30, and contaminates the inner surface 302 as a result is not preferable. Epoxy that is hard and has a high strength in general is often used for an adhesive agent. Note that, in the present embodiment, it is preferable to use an adhesive agent having rubber elasticity for reducing an influence of the difference in the linear expansion between the large solid state imaging device 10 of the APSC size or the FULL size and the printed board 20. A particularly preferable elastic modulus is 1 to 100 MPa. The adhesive agent 502 may be adhered to a whole or a part of the back surface 102 of the solid state imaging device 10. Further, the adhesive agent 502 may be adhered to a part of the outer edge 105 of the solid state imaging device 10.

Figure 5F:
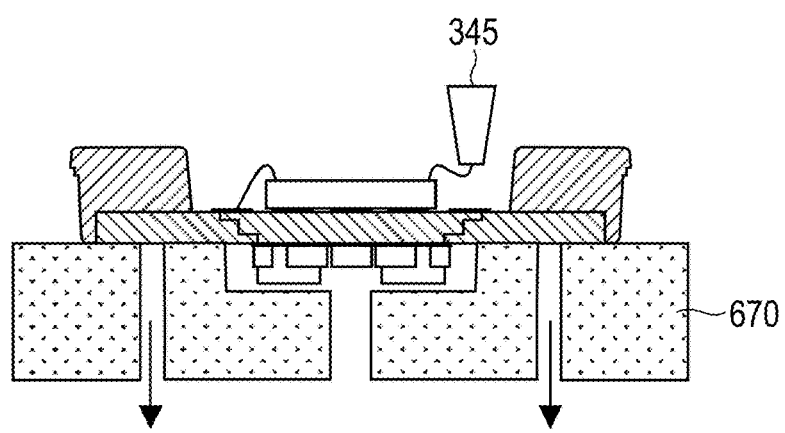

FIG. 5F illustrates a process of electrically connecting the solid state imaging device 10 and the printed board 20 to each other. In the present example, wire bonding connection is used. One end of a metal wire supplied from the tip of a capillary 345 is connected to the electrode 103, and the other end of the metal wire is then connected to the internal terminals 25. In such a way, the connection conductors 104 are formed from the metal wire. Note that, when flip-chip connection is employed, a bump can serve as both the adhesive agent 502 and the connection conductors 104.

Figure 5G:
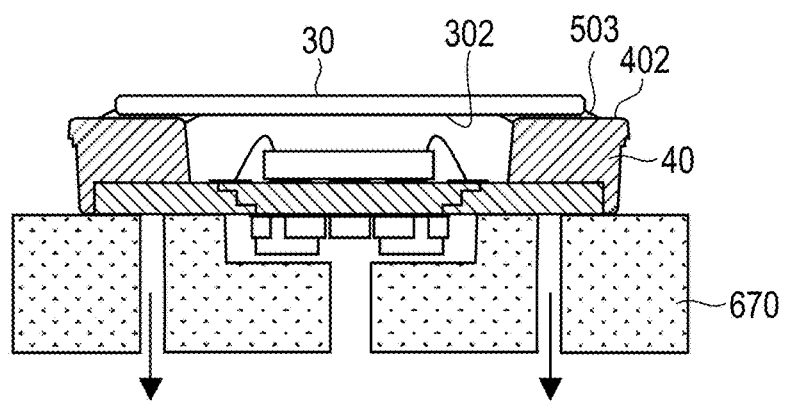

FIG. 5G illustrates a process of adhering the light transmitting member 30 to the resin frame 40. Note that FIG. 5G illustrates the imaging device module 1 after all the internal terminals 25 and the all the electrodes 103 are connected to each other by the connection wirings 104.

The adhesive agent 503 is applied to at least one of the junction surface 402 of the resin frame 40 and the inner surface 302 that is a junction surface of the light transmitting member 30. As described above, the typical adhesive agent 503 is a photo-curing resin. A printing method, a dispense method, or the like may be used for application of the adhesive agent 503. Next, the light transmitting member 30 is placed on the resin frame 40. At this time, the adhesive agent 503 is a liquid. Thus, the light transmitting member 30 is pushed against the resin frame 40 by the weight of the light transmitting member 30 or pressing of the light transmitting member 30, and the extra adhesive agent 503 may come out of the gap between the resin frame 40 and the light transmitting member 30. Then, the applied adhesive agent 503 is solidified by a suitable method. Thereby, the liquid adhesive agent 503 changes to the solid adhesive agent 503, and the resin frame 40 and the light transmitting member 30 are adhered to each other via the adhesive agent 503.

When the adhesive agent 503 is formed around the entire circumference of the junction interface, a use of a thermosetting adhesive agent as the adhesive agent 503 may cause the internal space 510 to expand due to heat at heating and push out the liquid state adhesive agent 503 due to the internal pressure. In the present embodiment, a use of a photo-curing resin as the adhesive agent 503 can prevent such leaching of the adhesive agent 503. Note that, after a photo-curing adhesive agent has been semi-cured by photo-curing, thermosetting can be used secondarily as post-curing. In a preferable use of the photo-curing adhesive agent 503, it is preferable that the light transmitting member 30 have sufficient light transmittivity to a wavelength such as an ultraviolet ray to which the adhesive agent 503 reacts.

As discussed above, the imaging device package 50 and the imaging device module 1 of the present embodiment can be manufactured.

Figure 6A:
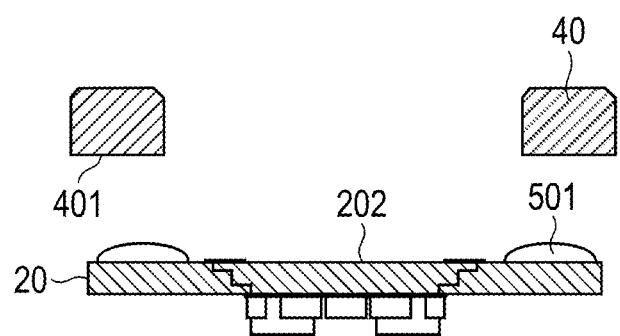
FIG. 6A and FIG. 6B are diagrams illustrating a manufacturing method of the imaging device module according to the modified example of the first embodiment.
Figure 6B:
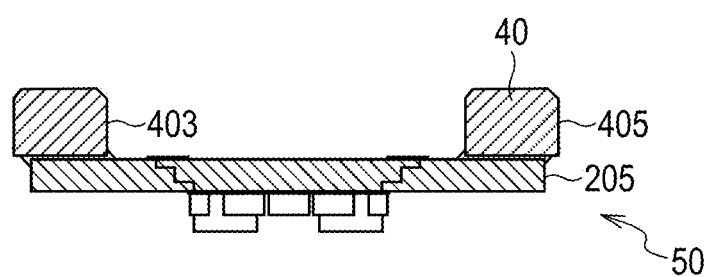

Next, a manufacturing method of the imaging device package 50 and the imaging device module 1 according to a modified example of the present embodiment will be described. FIG. 6A and FIG. 6B illustrate the manufacturing method of the imaging device package 50 according to the modified example. FIG. 6A illustrates a process corresponding to FIG. 5C, and FIG. 6B illustrates a process corresponding to FIG. 5D. The imaging device package 50 in the present embodiment can be obtained by adhering, to the inner surface 202 of the printed board 20, the resin frame 40 that has been separately fabricated. FIG. 6A illustrates a process of applying the adhesive agent 501 on the inner surface 202 of the printed board 20. In this example, the resin frame 40 formed in advance is prepared.

It is preferable to form unevenness on the surface of the resin frame 40 by using sandblast processing. The adhesive agent 501 is applied to at least one of the inner surface 202 of the printed board 20 and the junction surface 401 of the resin frame 40. The typical adhesive agent 501 is a thermosetting resin. A printing method, a dispense method, or the like may be used for application of the adhesive agent 501.

Next, the resin frame 40 is placed on the inner surface 202 of the printed board 20. At this time, the adhesive agent 501 is a liquid. Thus, the resin frame 40 is pressed against the printed board 20 by the weight of the resin frame 40 or pressing of the resin frame 40, and thereby the extra adhesive agent 501 may come out of the gap between the resin frame 40 and the printed board 20. It is desirable that the outer edge 405 of the resin frame 40 illustrated in FIG. 6B be larger than the outer edge 205 of the printed board 20 to prevent the pushed out adhesive agent 501 from hanging down.

Next, the adhesive agent 501 is solidified by a suitable method. The preferable adhesive agent 501 is a thermosetting resin and is thermoset by heat at around 80 to 200 degrees Celsius. Thereby, the liquid adhesive agent 501 becomes a solid, and the resin frame 40 and the printed board 20 are adhered to each other via the adhesive agent 501. Furthermore, after the thermosetting, the resin frame 40 and the printed board 20 are cooled to a predetermined temperature (for example, a room temperature). The cooling method is not particularly limited and may be natural cooling or may be forced cooling using air cooling or the like. In such a way, the imaging device package 50 having the resin frame 40 and the printed board 20 can be manufactured. The imaging device module 1 of the modified example illustrated in FIG. 3A to FIG. 3C can be manufactured from the imaging device package 50 of the present embodiment by the same method as the manufacturing method in FIG. 5A to FIG. 5G.

Next, a linear expansion coefficient $\alpha c$ of the solid state imaging device 10, a linear expansion coefficient $\alpha PCB$ of the printed board 20, a linear expansion coefficient $\alpha f$ of the resin frame 40, and a linear expansion coefficient $\alpha L$ of the light transmitting member 30 in the present embodiment will be described.

The solid state imaging device 10 is mainly formed of a silicon wafer. Therefore, the ratio of thermal expansion and contraction at heating or cooling can be considered to be the linear expansion coefficient of a crystal silicon. Although the crystal silicon is anisotropic and thus exhibits different linear expansion coefficients depending on the crystal axis direction in a strict sense, the anisotropy may be ignored in the present embodiment. Therefore, the linear expansion coefficient $\alpha c$ of the solid state imaging device 10 may be 3 to 4 ppm/degree Celsius.

The printed board 20 includes at least a plurality of conductor layers and insulating layers between the conductor layers, as illustrated in the enlarged view of the portion D of FIG. 2A to FIG. 2C and FIG. 4A to FIG. 4C. In general, copper is used for a conductor layer. A prepreg is used for the printed board 20 of the present embodiment. The prepreg is obtained by impregnating a resin into woven or braided cross fibers. A glass fiber is used for the fiber. Epoxy is mainly used for the resin. The resin may include an organic or inorganic filler, a curing agent, a coupling agent, a frame retardant, a coloring matter, or the like. The printed board 20 may have the solder resist layer 230 in addition. As illustrated in FIG. 2A to FIG. 2C and FIG. 4A to FIG. 4C, the printed board 20 has the multilayer structure composed of a plurality of layers parallel to the X-Y plane.

Since the printed board 20 has the multilayer structure, there are many parameters that influence the linear expansion coefficient in the in-plane direction of the printed board 20. The parameters mainly causing influences are the thickness of the conductor layers, the residual rate of the conductor layers after patterning (projection area ratio onto the X-Y plane before and after patterning), the number of conductor layers, the linear expansion coefficient of the conductor, the elastic modulus of the conductor, the thickness the prepreg, the number of layers thereof, the linear expansion coefficient in the in-plane direction of the prepreg, and the bending elastic modulus in the Z-direction of the prepreg. With adjustment of these parameters, the linear expansion coefficient $\alpha PCB$ in the in-plane direction of the printed board 20 is determined.

When the conductor layer is copper, the linear expansion coefficient of the conductor layer is around 17 ppm/degree Celsius, and the elastic modulus is 100 to 120 GPa.

The linear expansion coefficient of the prepreg exhibits anisotropy depending on the direction of the cross fiber included therein. When the prepreg includes a cross in which fibers in the X-direction and fibers in the Y-direction are woven, the linear expansion coefficient will be small in the X-direction and the Y-direction. On the other hand, in the Z-axis direction orthogonal to the fibers, the linear expansion coefficient will be relatively large. Further, the density of the number of fibers of the cross is different between the X-direction and the Y-direction, the linear expansion coefficients are different from each other for the X-direction and the Y-direction. Further, the linear expansion coefficient varies in accordance with the type of a resin impregnated in the cross, the type of a filler, or the amount of an additive. When the prepreg is glass epoxy, the linear expansion coefficient in the in-plane direction on the X-Y plane is 0.5 to 30 ppm/degree Celsius. On the other hand, the linear expansion coefficient in the Z-direction is 1 to 300 ppm/degree Celsius. Further, the bending elastic modulus of the prepreg against the bending in the Z-axis direction is 3 to 100 GPa.

The linear expansion coefficient of the solder resist layer 230 is 1 to 300 ppm/degree Celsius. Further, the elastic modulus is 100 MPa to 10 GPa. The solder resist layer 230 has a thickness of 4 to 30 μm in general and is thinner than the total thickness of the printed board. Thus, the solder resist layer 230 less contributes to the $\alpha PCB$.

The prepreg has a glass transition temperature Tgp. This is substantially the same as the glass transition temperature of the impregnated resin. The linear expansion coefficient in the in-plane direction of the prepreg is different between at a higher temperature and at a lower temperature with respect to the glass transition temperature Tgp. The linear expansion coefficient is larger at a temperature higher than the glass transition temperature Tgp. Thus, with respect to the printed board 20 that is a multilayer member including the prepreg, the linear expansion coefficient $\alpha PCB$ in the in-plane direction at a temperature higher than the glass transition temperature Tgp and the linear expansion coefficient $\alpha PCB$ in the in-plane direction at a temperature lower than the glass transition temperature Tgp are values different from each other. The linear expansion coefficient at a temperature lower than the glass transition temperature Tgp is denoted as αPCB1, and the linear expansion coefficient at a temperature higher than the glass transition temperature Tgp is denoted as αPCB2.

The resin frame 40 is a mixture of a resin and a filler as described above. Therefore, the linear expansion coefficient of the resin frame 40 is determined by the linear expansion coefficient of the resin, the elastic modulus of the resin, the linear expansion coefficient of the filler, the size of the filler, the filling rate of the filler, and the elastic modulus of the filler. The resin frame 40 also has the glass transition temperature Tgf. The glass transition temperature Tgf of the resin frame 40 is substantially the same as the glass transition temperature of the resin included in the resin frame 40. When the filler contains an organic filler, however, the glass transition temperature of the filler influences the glass transition temperature of the resin frame 40. The linear expansion coefficient of the resin frame 40 is different between at a higher temperature and at a lower temperature with respect to the glass transition temperature Tgf. The linear expansion coefficient is larger at a temperature higher than the glass transition temperature Tgf. The linear expansion coefficient at a temperature lower than the glass transition temperature Tgf is denoted as αf1, and the linear expansion coefficient at a temperature higher than the glass transition temperature Tgf is denoted as αf2.

As described above, a resin, a glass, a sapphire, a quartz, or the like can be used as the light transmitting member 30. The resin may be an acrylic resin or a polycarbonate resin. The linear expansion coefficient of the above is 50 to 100 ppm/degree Celsius. The linear expansion coefficient of glass and sapphire is 1 to 10 ppm/degree Celsius. A borosilicate glass or a quartz glass is preferable for the glass. In the crystalline member such as sapphire, quartz, or the like, the linear expansion coefficient relative to the crystal axis direction and the linear expansion coefficient relative to the direction perpendicular to the crystal axis are different from each other. The linear expansion coefficient in the crystal axis direction of sapphire is 7.7 ppm/degree Celsius, the linear expansion coefficient in the direction perpendicular to the crystal axis is 7 ppm/degree Celsius, and the difference between the two values is small. However, the linear expansion coefficient in the crystal axis direction of quartz is 8 ppm/degree Celsius, and the linear expansion coefficient in the direction perpendicular to the crystal axis is 13.4 ppm/degree Celsius, which are relatively much different. A quartz member can be attached to the resin frame 40 as a component of a so-called optical low-pass filter. In this case, the crystal axis of quartz is required to be inclined by 45 degrees relative to the Z-direction. In such a case, the linear expansion coefficient αL to the in-plane direction of the light transmitting member 30 is 10 to 13.4 ppm/degree Celsius.

Thermal Mechanical Analysis (TMA) can be used as a measuring method of the above linear expansion coefficients. Further, the linear expansion coefficient of a multilayer member such as the printed board 20 or an anisotropic member can be measured by utilizing a dilatometer in accordance with a method conforming to ASTM D696. Furthermore, a dimensional change of a sample may be measured directly by a camera. The linear expansion coefficient can be measured by holding a sample in the constant temperature chamber and using Digital Image Correlation (DIC) with a use of a camera.

Figure 7:
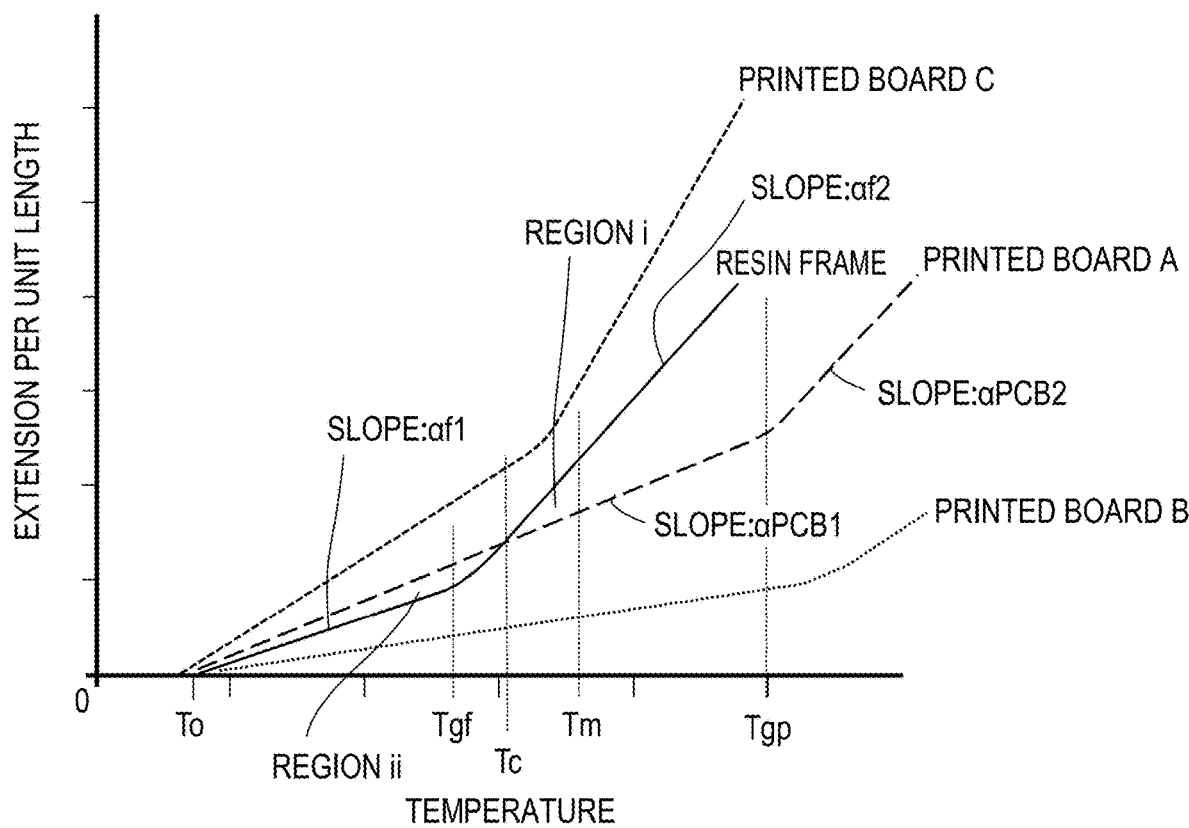
FIG. 7 is a diagram illustrating an advantage of the first embodiment.

FIG. 7 illustrates a relationship of linear expansion coefficients of respective members in the first embodiment. In FIG. 7, the horizontal axis represents the temperature of a member, and the vertical axis represents an extension amount per unit length of each member when the extension of the member at a room temperature To is defined as zero. That is, FIG. 7 represents a graph in which the extension amount per unit length of each member is plotted at each temperature. The slope of a graph represents a linear expansion coefficient of a member, and the temperature of a point at which the graph bends represents the glass transition point of the member.

For example, since the graph of the resin frame bends at the temperature Tgf, the glass transition temperature of the resin frame is Tgf. The slope of the graph below the glass transition temperature Tgf indicates the linear expansion coefficient αf1 of the resin frame at a temperature below the glass transition temperature Tgf. Further, the slope of the graph temperature above the glass transition temperature Tgf indicates the linear expansion coefficient αf2 of the resin frame at a temperature above the glass transition temperature Tgf.

In FIG. 7, the graph of the printed board 20 in the first embodiment is denoted as a printed board A, which bends at the glass transition temperature Tgp. Therefore, the glass transition temperature of the printed board 20 is the temperature Tgp. The slope of the graph below the glass transition temperature Tgp indicates the linear expansion coefficient αPCB1 in the in-plane direction of the printed board 20 below the glass transition temperature Tgp. Further, the slope of the graph above the glass transition temperature Tgp indicates the linear expansion coefficient αPCB2 in the in-plane direction of the printed board 20 above the glass transition temperature Tgp. Note that the room temperature To means a normal room temperature, which is 20 to 30 degrees Celsius and 25 degrees Celsius in average. In the first embodiment, it is desirable that the glass transition temperatures Tgp and Tgf, the room temperature To, and the linear expansion coefficients αf1, αf2, αPCB1, and αPCB2 satisfy the following expressions.

$$Tgp > Tgf,$$

$$\alpha f1 < \alpha PCB1, \text{ and}$$

$$(Tgp-To) \times \alpha PCB1 < (Tgf-To) \times \alpha f1 + (Tgp-Tgf) \times \alpha f2$$

When the above expressions are satisfied, the graph of the printed board 20 (printed board A) and the graph of the resin frame 40 have an intersection, as illustrated in FIG. 7. The temperature at the intersection is denoted as Tc. FIG. 10A illustrates a state where the resin frame 40 and the printed board 20 are fixed at the temperature Tm. When the printed board 20 is inserted in the mold described above and molded, FIG. 10A illustrates a state where the printed board 20 and the resin frame 40 that are integrated have been taken out from the mold at the temperature Tm. In this state, the printed board 20 and the resin frame 40 are flat.

FIG. 10B illustrates a state that is cooled from the temperature Tm to the temperature Tc. According to the graph of FIG. 7, the linear expansion coefficient of the resin frame 40 is higher than the linear expansion coefficient of the printed board 20 between the temperature Tm and the temperature Tc. Thus, in a process of cooling from the temperature Tm to the temperature Tc, the resin frame 40 more contracts than the printed board 20. Thus, as illustrated in FIG. 10B, the printed board 20 and the resin frame 40 are warped in a concave shape at the temperature Tc.

Furthermore, FIG. 10C illustrates a state that is cooled from the temperature Tc to the temperature (room temperature) To. Similarly, according to the graph of FIG. 7, the linear expansion coefficient of the printed board 20 is higher than the linear expansion coefficient of the resin frame 40 between the temperature Tc and the room temperature To. Thus, in the process of cooling from the temperature Tc to the room temperature To, the printed board 20 more contracts than the resin frame 40. Thus, as illustrated in FIG. 10C, the printed board 20 and the resin frame 40 return to be flat at the room temperature To. At this time, to recover a flatter state, the area of a region i interposed between the graph of the printed board 20 (printed board A) and the graph of the resin frame 40 between the temperature Tc and the temperature Tm is preferably the same as the area of a region ii interposed between the graph of the printed board 20 (printed board A) and the graph of the resin frame 40 between the room temperature To and the temperature Tc in the graph of FIG. 7. The integrated value of the graph of the linear expansion coefficient of a member within a predetermined temperature range corresponds to the amount of contraction of the member within the temperature range. Thus, when the area of the region i is the same as the area of the region ii, the amount of contraction of the printed board 20 is the same as the amount of contraction of the resin frame 40 between the temperature Tm and the room temperature To as a result. This can suppress deformation of the printed board 20 and the resin frame 40 due to a change in the temperature.

If the linear expansion coefficient in the in-plane direction of the printed board 20 is a value of the graph illustrated with the printed board B in FIG. 7, the linear expansion coefficient of the printed board B will be always below the linear expansion coefficient of the resin frame between the temperature Tm and the room temperature To. Thus, in the process of cooling from the temperature Tm to the room temperature To, the resin frame 40 may more contract than the printed board 20. As a result, since the printed board 20 and the resin frame 40 significantly deform in a concave shape at the room temperature To, this may result in insufficient adsorptive immobilization of a work to a work stage in an assembly apparatus when a solid state imaging device module is assembled, which may cause a problem of a reduction in assembly accuracy. Furthermore, a problem of a reduction in a working rate of the apparatus, a reduction in yield, or the like may arise.

Further, if the linear expansion coefficient in the in-plane direction of the printed board 20 is a value of the graph illustrated with the printed board C in FIG. 7, the linear expansion coefficient of the printed board C will be always above the linear expansion coefficient of the resin frame 40 between the temperature Tm and the room temperature To. Thus, in the process of cooling from the temperature Tm to the room temperature To, the printed board 20 may more contract than the resin frame 40. As a result, the printed board 20 and the resin frame 40 significantly deform in a convex shape at the room temperature To. Thus, adsorptive immobilization of a work to a work stage in an assembly apparatus may be insufficient when an imaging device module is assembled, which may cause a problem of a reduction in assembly accuracy. Furthermore, a problem of a reduction in a working rate of the apparatus, a reduction in yield, or the like may arise.

Figure 8:
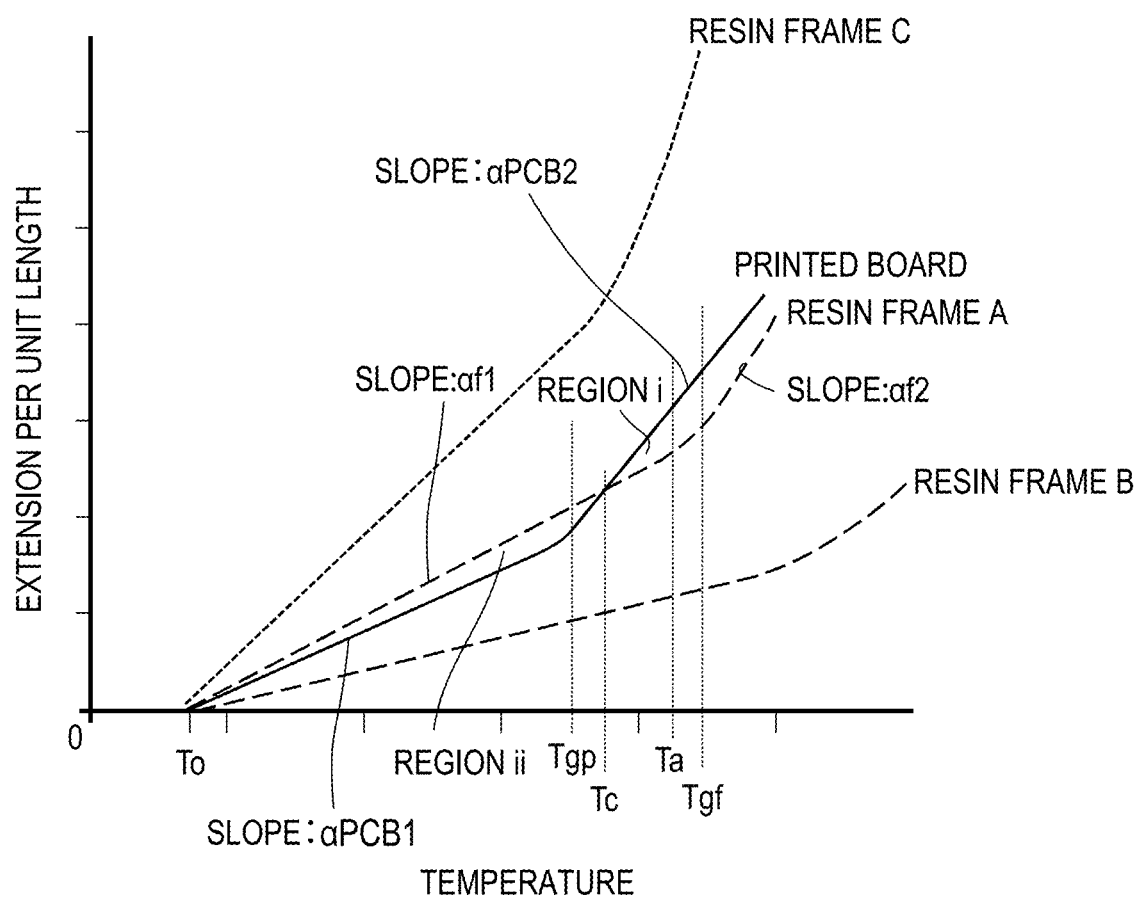
FIG. 8 is a diagram illustrating an advantage of the first embodiment.

FIG. 8 illustrates a relationship of linear expansion coefficients of respective members in another example. In FIG. 8, as with FIG. 7, the horizontal axis represents the temperature of a member, and the vertical axis represents an extension amount per unit length of each member when the extension of the member at a room temperature To is defined as zero. That is, FIG. 8 represents a graph in which the amount per unit length of each member is plotted. The slope of a graph represents a linear expansion coefficient of a member. The temperature at which the graph bends is the glass transition temperature of the member.

The graph of the printed board 20 bends at the temperature Tgp. Therefore, the glass transition temperature of the printed board 20 is Tgp. The slope of the graph below the temperature Tgp indicates the linear expansion coefficient $\alpha PCB1$ of the printed board 20 at a temperature below the temperature Tgp. Further, the slope of the graph above the temperature Tgp indicates the linear expansion coefficient $\alpha PCB2$ of the printed board 20 at a temperature above the temperature Tgp.

In FIG. 8, the graph for the resin frame 40 is denoted as a resin frame A, which bends at the temperature Tgf. Therefore, the glass transition temperature of the resin frame 40 is the temperature Tgf. The slope of the graph below the temperature Tgf indicates the linear expansion coefficient $\alpha f1$ of the resin frame 40 below the temperature Tgf. Further, the slope of the graph above the temperature Tgf indicates the linear expansion coefficient $\alpha f2$ of the resin frame 40 above the temperature Tgf. The room temperature To represents a normal room temperature in the same manner as FIG. 7.

In FIG. 8, it is desirable that the temperatures Tgp, Tgf, and To and the linear expansion coefficients $\alpha f1$, $\alpha f2$, $\alpha PCB1$, and $\alpha PCB2$ satisfy the following expressions.

$$Tgp < Tgf,$$

$$\alpha PCB1 < \alpha f1, \text{ and}$$

$$(Tgf-To) \times \alpha f1 < (Tgp-To) \times \alpha PCB1 + (Tgf-Tgp) \times \alpha PCB2$$

Figure 11A:
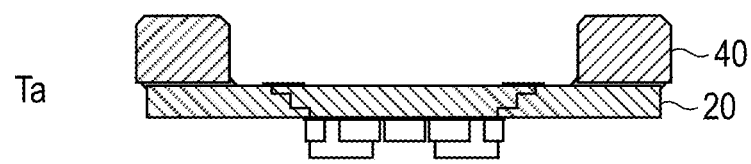
FIG. 11A, FIG. 11B, and FIG. 11C are diagrams illustrating an advantage of the first embodiment.

When the above expressions are satisfied, the graph of the printed board 20 and the graph of the resin frame 40 (resin frame A) have an intersection, as illustrated in FIG. 8. The temperature at the intersection is denoted as Tc. FIG. 11A illustrates a state where the resin frame 40 and the printed board 20 are fixed at the temperature Ta. When the resin frame 40 described above is adhered to the printed board 20 via the adhesive agent 501, FIG. 11A illustrates a state where the printed board 20 and the resin frame 40 that are integrated have been taken out from the oven at the temperature Ta. In this state, the printed board 20 and the resin frame 40 are flat.

Figure 11B:
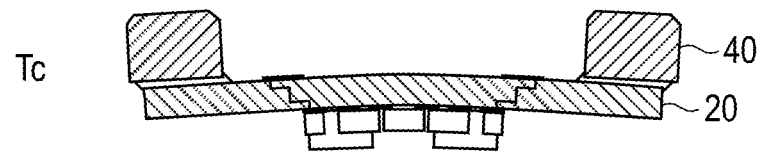

FIG. 11B illustrates a state that is cooled from the temperature Ta to the temperature Tc. According to the graph of FIG. 8, the linear expansion coefficient of the printed board 20 is higher than the linear expansion coefficient of the resin frame 40 between the temperature Ta and the temperature Tc. Thus, in a process of cooling from the temperature Ta to the temperature Tc, the printed board 20 more contracts than the resin frame 40. Thus, as illustrated in FIG. 11B, the printed board 20 and the resin frame 40 are warped in a convex shape at the temperature Tc.

Figure 11C:
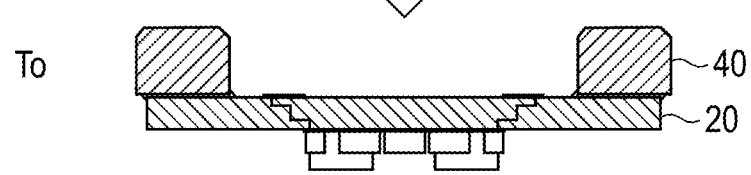

Furthermore, FIG. 11C illustrates a state that is cooled from the temperature Tc to the room temperature To (room temperature). Similarly, according to the graph of FIG. 8, the linear expansion coefficient of the resin frame 40 is higher than the linear expansion coefficient of the printed board 20 between the temperature Tc and the room temperature To. Thus, in the process of cooling from the temperature Tc to the room temperature To, the resin frame 40 more contracts than the printed board 20. Thus, as illustrated in FIG. 11C, the printed board 20 and the resin frame 40 return to be flat at the room temperature To. At this time, to allow the printed board 20 and the resin frame 40 to return to a flatter state, the area of a region i interposed between the graph of the printed board 20 and the graph of the resin frame 40 (resin frame A) between the temperature Tc and the temperature Ta is preferably the same as the area of a region ii that is a region interposed between the graph of the printed board 20 and the graph of the resin frame 40 (resin frame A) between the room temperature To and the temperature Tc in the graph of FIG. 8. As with the first embodiment, when the area of the region i is the same as the area of the region ii, the amount of contraction of the printed board 20 is the same as the amount of contraction of the resin frame 40 between the temperature Ta and the room temperature To as a result. This can suppress deformation of the printed board 20 and the resin frame 40 due to a change in the temperature.

If the linear expansion coefficient of the resin frame 40 is a value of the graph illustrated with the resin frame B in FIG. 8, the linear expansion coefficient of the resin frame B will be always below the linear expansion coefficient of the resin frame between the temperature Ta and the room temperature To. Thus, in the process of cooling from the temperature Ta to the room temperature To, the printed board 20 will more contract than the resin frame 40. As a result, since the printed board 20 and the resin frame 40 will significantly warp in a convex shape at the room temperature To, this may result in insufficient adsorptive immobilization of a work to a work stage in an assembly apparatus when a solid state imaging device module is assembled, which may cause a problem of a reduction in assembly accuracy. Furthermore, a problem of a reduction in a working rate of the apparatus, a reduction in yield, or the like may arise.

Further, if the linear expansion coefficient in the in-plane direction of the resin frame 40 is a value of the graph illustrated with the resin frame C in FIG. 8, the linear expansion coefficient of the resin frame C will be always above the linear expansion coefficient of the printed board between the temperature Ta and the room temperature To. Thus, in the process of cooling from the temperature Ta to the room temperature To, the resin frame 40 will contract than the printed board 20. As a result, since the printed board 20 and the resin frame 40 will significantly warp in a concave shape at the room temperature To, this may result in insufficient adsorptive immobilization of a work to a work stage in an assembly apparatus when a solid state imaging device module is assembled, which may cause a problem of a reduction in assembly accuracy. Furthermore, a problem of a reduction in a working rate of the apparatus, a reduction in yield, or the like may arise.

In the present embodiment, in addition that the room temperature To, the temperatures Tgp and Tgf, the linear expansion coefficients $\alpha f1$, $\alpha f2$, $\alpha PCB1$, and $\alpha PCB2$ satisfy the conditions described above, it is preferable that the linear expansion coefficients $\alpha PCB1$ and $\alpha f1$ be smaller than the linear expansion coefficient $\alpha L$ in the in-plane direction of the light transmitting member 30 and larger than the linear expansion coefficient $\alpha c$ in the in-plane direction of the solid state imaging device 10.

Figure 9:
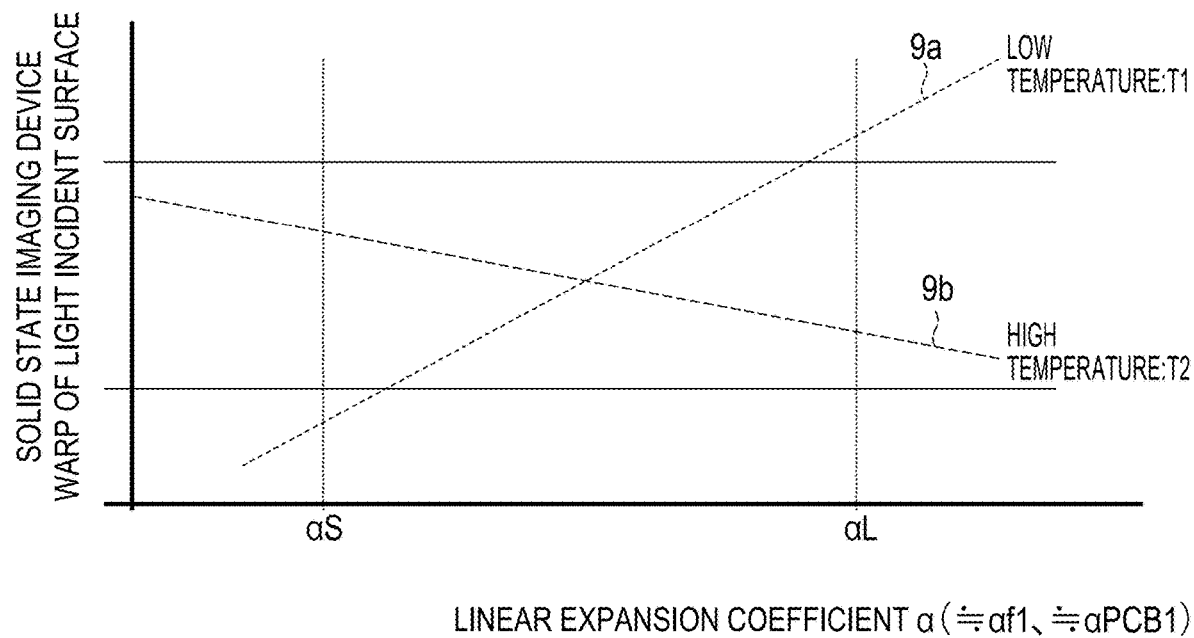
FIG. 9 is a diagram illustrating an advantage of the first embodiment.

The reason for the above will be described by using FIG. 9. In the conditions described above, the linear expansion coefficients $\alpha PCB1$ and $\alpha f1$ are not the same but close to each other. In particular, FIG. 9 illustrates a case where the linear expansion coefficients $\alpha PCB1$ and $\alpha f1$ are the same. In FIG. 9, the horizontal axis represents the linear expansion coefficient $\alpha$, the vertical axis represents an amount of warp of the light incident surface of the solid state imaging device 10. The graph 9a represents an amount of warp of the light incident surface when the temperature of the imaging device module is a low temperature T1, and the graph 9b represents a deformation amount when the temperature of the imaging device module is a high temperature T2.

In FIG. 9, when the linear expansion coefficient $\alpha$ is a median value of the linear expansion coefficient $\alpha c$ of the solid state imaging device 10 and the linear expansion coefficient $\alpha L$ of the light transmitting member 30, it can be seen that the amount of warp of the surface of the solid state imaging device 10 is constant even when the temperature of the solid state imaging device module changes from the low temperature T1 to the high temperature T2. That is, in such a case, it is possible to suppress warp of the surface of the solid state imaging device 10 in a wide temperature range. In the present embodiment, it is appreciated that the linear expansion coefficients $\alpha PCB1$ and $\alpha f1$ are not necessarily the same but close to each other and thus result in the same characteristics as that in FIG. 9. It is therefore preferable that the linear expansion coefficients of respective members satisfy the expression of $\alpha c < \alpha PCB \approx \alpha f1 < \alpha L$. It is more preferable to satisfy $\alpha PCB \approx \alpha f1 \approx (\alpha c + \alpha L)/2$.

Figure 12A:
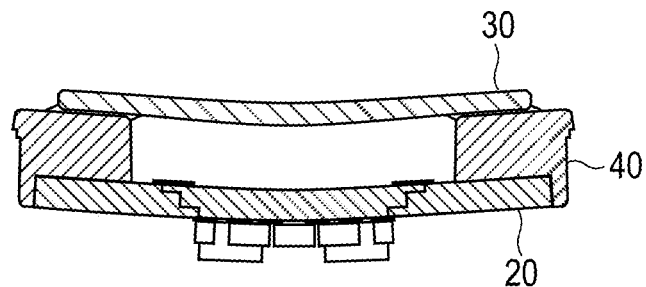
FIG. 12A, FIG. 12B, and FIG. 12C are diagrams illustrating an advantage of the first embodiment.
Figure 12B:
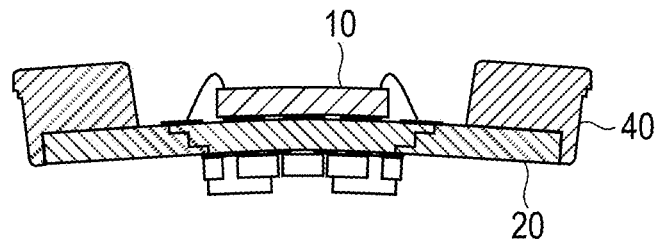
Figure 12C:
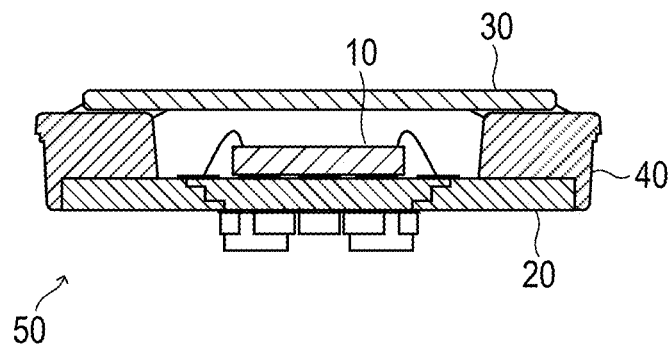

The reason for the above will be described by using FIG. 12A, FIG. 12B, and FIG. 12C. FIG. 12A illustrates a sectional view of the imaging device module in which the solid state imaging device 10 is virtually not provided at the low temperature T1. In such a case, since the linear expansion coefficients of respective members will be $\alpha f1 \approx \alpha PCB1 < \alpha L$, an effect causing the cross section to deform in a concave shape works on the imaging device module. On the other hand, FIG. 12B illustrates a sectional view of the imaging device module in which the light transmitting member 30 is virtually not provided at the low temperature T1. Since the linear expansion coefficients of respective members will be $\alpha c < \alpha f1 \approx \alpha PCB1$, an effect causing deformation to a convex shape works on the printed board 20 and the resin frame 40. As illustrated in FIG. 12C, in the entire actual imaging device module, the effects illustrated in FIG. 12A and FIG. 12B are offset, no deformation occurs, and the cross sectional shape is maintained to be flat.

Figure 13A:
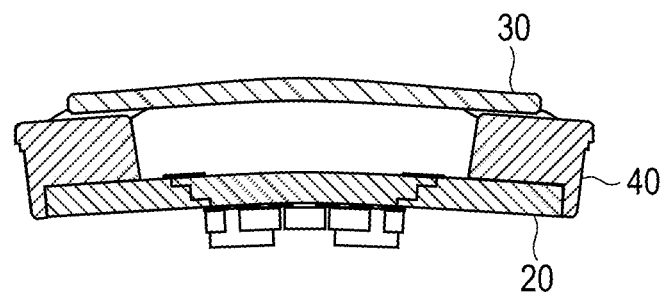
FIG. 13A, FIG. 13B, and FIG. 13C are diagrams illustrating an advantage of the first embodiment.
Figure 13B:
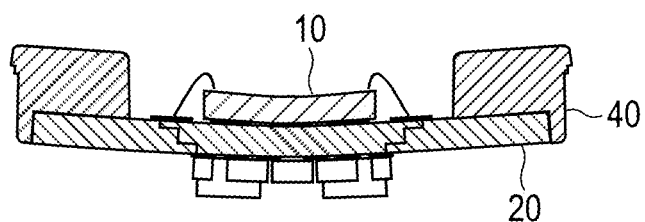
Figure 13C:
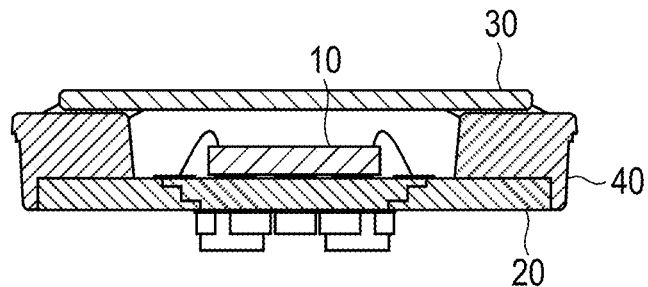

Similarly, FIG. 13A illustrates a sectional view of the imaging device module in which the solid state imaging device 10 is virtually not provided at the high temperature T2. In such a case, since the linear expansion coefficients of respective members will be $\alpha f1 \alpha \approx PCB1 < \alpha L$, an effect causing deformation to a convex shape works on the imaging device module. On the other hand, FIG. 13B illustrates a sectional view of the imaging device module in which the light transmitting member 30 is virtually not provided at the high temperature T2. Since the linear expansion coefficients of respective members will be $\alpha c < \alpha f1 \approx \alpha PCB1$, an effect causing deformation to a concave shape works on the printed board 20 and the resin frame 40. As illustrated in FIG. 13C, in the entire actual imaging device module, the effects illustrated in FIG. 13A and FIG. 13B are offset, no deformation occurs, and the cross sectional shape is maintained to be flat.

As described above, according to the present embodiment, an imaging device module in which deformation is less likely to occur in a wide temperature range can be obtained.

Note that it is preferable that the adhesive agent 502 used for adhering the solid state imaging device 10 to the printed board 20 have rubber elasticity. This is because the effect caused by the linear expansion coefficients $\alpha c \ll \alpha f1 \approx \alpha PCB1$ can be mitigated by expansion of the adhesive agent 502. Therefore, in such a case, it is preferable to satisfy $\alpha f1 \approx \alpha PCB1 \approx < \alpha L$.

According to the present embodiment, with the configuration in which respective deformation amounts of the printed board and the resin frame due to the temperature are offset, an imaging device module in which warp is significantly small can be provided.

As described above, in a large imaging device module such as the APSC size, the FULL size, or the like, an imaging device package having solder terminals of a land grid array (LGA) type or a leadless chip carrier (LCC) type is employed. Since each wiring interval is widened by one step to the pitch (0.8 to 1.5 mm) between solder terminals on a printed board, the length of a wiring from the terminals of the solid state imaging device to the bypass capacitor and a wiring of a ground loop or a power source loop may be relatively long. In such a way, when the inductance of wirings cannot be ignored, it is necessary to suppress high-frequency noise. In particular, when the loop area is larger due to a longer ground loop or a longer power source loop, magnetic noise due to a change in a magnetic field passing through the loop cannot be ignored. The number of pixels and the number of times of capturing per unit time of the solid state imaging device have increased, the output has been digitalized, and there is a growing need for enhancing a transmission speed of output signals of the solid state imaging device. Thus, high speed serial transmission such as Low Voltage Differential Signaling) LVDS, Scalable Low Voltage Signaling (SLVS), or the like has been used. In high speed serial transmission, the amplitudes of signals to be processed have become smaller, the frequencies thereof have become higher, and thus the inductance of wirings or the loop area cannot be ignored. Furthermore, since a high speed transmission signal transmits with a small amplitude, a transmission wiring is preferably a wiring in which impedance is matched and power loss is small, and there is increasing need for using copper wirings.

Japanese Patent Application Laid-Open No. 2015-185763 described above discloses a configuration in which a solid state imaging device is directly mounted on the front surface of a substrate whose back surface has electronic components such as a bypass capacitor, a power source IC, a connector, or the like mounted, and thereby the length of wirings from a power source input PAD of a serial transmission circuit of the solid state imaging device to the bypass capacitor is smaller than before, and the inductance of the wirings can be reduced. Furthermore, with such a configuration, since the length of wirings can be reduced, the loop area of the power source loop or the ground loop can be suppressed to be small. In Japanese Patent Application Laid-Open No. 2015-185763, however, when a printed board using a prepreg for a substrate and including copper wirings having smaller power loss is used, the rigidity of the substrate is low and thus warp of the substrate may occur due to the difference in the linear expansion coefficient between members forming the imaging device module. In a process of manufacturing the imaging device module, a problem in transportation or adsorptive immobilization of the imaging device module may arise. Further, also after completion of the imaging device module, large warp may occur in the substrate due to a change in the temperature in the usage environment of the imaging device module, which may cause a problem of large warp in the light receiving surface of the solid state imaging device. In particular, when a solid state imaging device of the APSC size or the full size is embedded in a camera as with a Digital Single Lens Reflex (DSLR) camera, it is necessary to suppress warp of the surface of the solid state imaging device to a significantly small range. For example, it is preferable to suppress warp within 50 μm, preferably within 25 μm.

According to the present embodiment described above, with the configuration in which respective deformation amounts of the printed board and the resin frame due to the temperature are offset, an imaging device module in which warp is significantly small can be provided, and the above problems can be solved. Further, in particular, when a solid state imaging device is mounted on a printed board made of a prepreg, warp of a light receiving surface of the solid state imaging device that may occur due to a change in the temperature in a manufacturing process or a usage environment of the imaging device module can be suppressed to a significantly small range.

Example 1

The examples of the present invention will be described below. The imaging device modules 1 illustrated in FIG. 1A to FIG. 1B, FIG. 2A to FIG. 2C, and FIG. 5A to FIG. 5G were fabricated. First, the printed board 20 was fabricated. The glass transition temperature Tgp of the prepreg used was 220 degrees Celsius. A subtract method was used as the method. A so-called 2-4-2, 8-layer substrate formed a stack of two layers of laser vias and a core of four layers of drill vias was fabricated. A copper with a thickness of 20 μm was used as a conductor, and the patterning was applied by a lithography scheme. The thickness of the insulating layer between the conductors was 250 μm for the core and 50 μm for the other. The internal terminal 25 was patterned on the conductive layer of the inner surface 202, a solder terminal used for mounting an electronic component, an alignment mark used for mounting the electronic component, and a line of the pads 612 used for applying the test probe were patterned on the conductive layer of the outer surface 201, and both of the outer surface 201 and the inner surface 202 were covered with the solder resist layer 203 having the thickness of 20 μm. In patterning of the conductive layers, the pattern of each layer was adjusted such that, when the area before patterning is defined as 100, the area of the portion remaining after patterning becomes 70. As described above, it is preferable to adjust the area after patterning of each layer in order to adjust the linear expansion coefficient αPCB relative to the in-plane direction of the printed board 20 to a desired value.

Finally, after a necessary portion such as the internal terminal 25, the solder terminal, the pad, or the like was opened by patterning, a nickel plating of 4 μm to 100 μm and a gold plating of 0.1 μm to 0.8 μm was applied to the surface. The total thickness was 720 μm. The fabricated printed board was in an aggregate state in which four printed boards were included in one sheet, and the outer shape of each printed board was processed by router processing. While a plurality of portions for each printed board were left without router processing and the four printed boards were left as an integrated sheet form, the printed board fabrication process was finished.

After the fabrication of the printed board, the linear expansion coefficient αPCB2 relative to the in-plane direction was measured. A known digital image correlation method was used for the measurement. As a result of the measurement, the glass transition temperature Tgp of the printed board was 220 degrees Celsius. Further, the linear expansion coefficient αPCB1 at a temperature below the glass transition temperature Tgp was 10 ppm/degree Celsius, and the linear expansion coefficient αPCB at a temperature above the glass transition temperature Tgp was 20 ppm/degree Celsius.

Next, solder paste was printed on the solder terminal by using the solder paste and a printing machine, and the electronic components were mounted on the solder paste by using a mounter. While the solder paste contained flux, halogen free solder paste was used. The mounted electronic components were total 137 components including at least a ceramic capacitor, a tantalum capacitor, a chip resistor, a power supply IC, a B-to-B connector, a crystal oscillator, a PLL, an EPROM, a temperature measurement IC, and a transistor. After each electronic component was mounted, the printed board was passed through a known reflow oven, and the solder bonding was completed.

Next, the serial number and the data matrix code were printed on the solder resist layer on the outer surface 201 of the printed board 20 by using a laser marker. The used laser was yttrium vanadium tetraoxide (YVO4). Further, flux contained in the solder paste was removed by using a washer, a dryer, and a flux washing solution.

Next, by using a general press machine and a cutting mold, the portion that was a part of the outer shape of the printed board 20 and has not yet been processed by the router was cut, and the sheet-shaped printed board was cut and separated into individual printed boards 20. Next, the resin frame 40 was molded on the printed board 20. First, as illustrated in FIG. 5C, the printed board 20 on which the electronic components were mounted was held between the upper mold and the lower mold and fixed thereto. The mold was preheated at 150 degrees Celsius. Closed spaces 4003 in which the outer edge 205 and the outer circumference portion of the inner surface 202 of the printed board 20 were exposed were provided in the molds. A gate, a runner, a cull, and a pod were connected to the closed space 4003, a tablet containing epoxy as a main component and containing a curing agent, a silica filler, a coupling agent, a flame retardant, and a parting agent was inserted into the pod, and by pressurizing with a plunger, the closed space 4003 was filled with a resin. After filling, the resin was cured by being held for 3 minutes. The mold was opened after curing, the printed board 20 integrated with the resin frame was taken out, and the imaging device package 50 was taken out by trimming unnecessary gates, runners, and subsequent resins. The removed imaging device package 50 was put into the oven at 150 degrees Celsius and post-cured for 3 hours to finally cure the resin frame 40.

By using the molding of the used resin, the glass transition temperature and the linear expansion coefficient were measured by a Thermal Mechanical Analysis (TMA) measurement machine. As a result of the measurement, the glass transition temperature Tgf was 140 degrees Celsius, the linear expansion coefficient αf1 at a temperature below the glass transition temperature Tgf was 9 ppm/degree Celsius, and the linear expansion coefficient αf2 at a temperature above the glass transition temperature Tgf was 30 ppm/degree Celsius.

Next, a surface roughening process was performed on the upper surface 402 of the resin frame 40 of the complete imaging device package 50. Surface roughening was performed by a known method, and the arithmetic average roughness Ra was 7 to 10 μm. Further, the imaging device package was completed by cleaning the surface with a pure water washer and drying. When warp of a die-attach surface (a surface onto which the solid imaging device 10 was fixed) of the complete imaging device package was measured, the warp was approximately −10 μm. Further, the warp of the back surface of the imaging device package was approximately +10 μm, which was small. Here, minus represents the deformation in a concave shape in a cross section, and plus represents the deformation in a convex shape in a cross section.

Next, the imaging device module was assembled. First, in the CMOS wafer process and the color filter process, a plurality of solid state imaging devices 10 were formed on the surface of a silicon wafer having a thickness of 775 μm and a diameter of 12 inches, and singulation was performed by dicing. Next, the solid state imaging device 10 of the APSC size was obtained by performing surface cleaning of the singulated solid state imaging device. The linear expansion coefficient αc of the solid state imaging device 10 was 3 ppm/degree Celsius. The imaging device package 50 described above was adsorbed and fixed onto the adsorption stage 670 of a die bonder. The portions indicated by the arrows in FIG. 5E were vacuumed by a pump. No absorption was performed at the center portion because of the leakage to the atmosphere. The adsorption vacuum degree during vacuuming was −60 kPa. In this state, a silicone resin having rubber elasticity was applied on a part of the inner surface 202 of the printed board 20 and at the center of the printed board 20 included in the imaging device package 50 by a dispenser. The application shape was line-shaped, and three silicone resins were applied to a part having a long linear shape in the X-direction while being offset in the Y-direction in FIG. 5E. The solid state imaging device 10 was mounted on the applied silicone resins, and the entire imaging device package was put into an oven at 120 degrees Celsius. The entire imaging device package 50 was heated for 50 minutes in the oven to cure the silicone resin, and the imaging device package 50 and the solid state imaging device 10 were fixed to each other. The positional displacement in the X-direction and the Y-direction of the fixed solid state imaging device 10 was within 100 μm, and sufficient accuracy was obtained. Further, an amount of warp of the light incident surface of the solid state imaging device 10 was measured, and it was +10 μm. As described above, minus represents a concave deformation and plus represents a convex deformation.

Next, the electrode 103 of the solid state imaging device 10 and the internal terminal 25 of the printed board 20 were connected by using a wire bonder. A gold wire having a diameter of 23 μm was used for the wire. The same adsorption stage as that of the die bonder was used for the adsorption stage 670. The process was stably performed at the adsorption vacuum degree of −67 kPa. Finally, the light transmitting member 30 was adhered and fixed to the bonding surface 402 of the resin frame 40 by the adhesive agent 503. Here, quartz was used for the light transmitting member 30. The crystal axis of the quartz was set in a direction inclined by 45 degrees in the X-Z plane relative to the Z axis. At this time, the linear expansion coefficient of the quartz in the X-direction was 13 ppm/degree Celsius, and the linear expansion coefficient in the Y-direction was 10 ppm/degree Celsius. The used quartz had a thickness of 500 μm, and chamfering process was applied to four corners and eight ridgelines.

The apparatus was a mounter, and the same stage as that of the die bonder was used for the adsorption stage. The adsorption vacuum degree here was also −63 kPa, and the process was stably performed. The adhesive agent 503 was applied to the bonding surface 402 of the resin frame 40 with a known dispenser. At the time of application, a gap was partially provided for air release. An ultraviolet curing resin containing epoxy as a main component was used as the adhesive agent 503. To allow the stress generated proportionally to the difference between the linear expansion coefficient of the light transmitting member 30 and the linear expansion coefficient of the resin frame 40 to be absorbed by distortion of the adhesive agent 503, a resin spacer having a diameter of 30 µm was added to the adhesive agent, and the thickness of the adhesive agent was adjusted to 30 µm. Finally, the adhesive agent 503 was irradiated and cured with an ultraviolet ray of 4000 mJ. The elasticity modulus of the used adhesive agent 503 at the time of curing was 5 GPa.

As described above, the imaging device module of Example 1 was completed. In the complete imaging device module, warp of the solid state imaging device 10 was measured under the usage environment of a camera, which is between −40 degrees Celsius and 60 degrees Celsius. After the light transmitting member 30 was attached to the resin frame, warp of the surface of the solid state imaging device 10 was +10 µm at the room temperature, the warp was +20 µm when the temperature was decreased to −40 degrees Celsius, the warp was 0 µm when the temperature was increased to 60 degrees Celsius, and thus warp was sufficiently reduced. As described above, a preferable result was obtained.

Example 2

Features different from Example 1 will be mainly described below. In Example 2, the type of the prepreg used for the printed board 20 was different from Example 1. In the complete printed board 20, the glass transition temperature Tgp was 190 degrees Celsius, the linear expansion coefficient $\alpha PCB1$ at a temperature below the glass transition temperature Tgp was 12 ppm/degree Celsius, and the linear expansion coefficient $\alpha PCB2$ at a temperature above the glass transition temperature Tgp was 28 ppm/degree Celsius.

At this time, warp of the die-attach surface measured after the resin frame 40 was attached was 0 µm, which was small, and stable adsorption force was obtained in the die bonder, the wire bonder, and the light transmitting member mounter. After the solid state imaging device 10 was adhered to the imaging device package 50, warp of the solid state imaging device 10 was +20 µm. Further, warp of the solid state imaging device 10 measured after the light transmitting member 30 was attached to the resin frame 40 was +20 µm, that is, the warp was sufficiently small. Further, warp of the solid state imaging device 10 was +30 µm when the temperature of the imaging device module was decreased to −40 degrees Celsius, the warp was +10 µm when the temperature was increased to 60 degrees Celsius, and thus warp was sufficiently reduced.

Example 3

Next, Example 3 will be described focusing on features different from Example 1. In Example 3, a borosilicate glass was used as the light transmitting member 30 instead of quartz. The linear expansion coefficient $\alpha L$ of the borosilicate glass was 7 ppm/degree Celsius. At this time, warp of the die-attach surface measured after the resin frame 40 was attached was −10 µm, which was small, and stable adsorption force was obtained in the die bonder, the wire bonder, and the light transmitting member mounter. Warp of the solid state imaging device 10 measured after the solid state imaging device 10 was adhered to the imaging device package 50 was +10 µm, and warp of the surface of the solid state imaging device 10 measured after the light transmitting member 30 was attached to the resin frame 40 was +10 µm, that is, each warp was sufficiently small. Further, warp of the surface of the solid state imaging device 10 was +30 µm when the temperature of the imaging device module was decreased to −40 degrees Celsius, the warp was −10 µm when the temperature was increased to 60 degrees Celsius, and each warp was small. However, the change amount of warp increased.

Example 4

Next, Example 4 will be described focusing on features different from Example 2. In Example 4, a borosilicate glass was used as the light transmitting member 30 instead of quartz. The linear expansion coefficient $\alpha L$ of the borosilicate glass was 7 ppm/degree Celsius. At this time, warp of the die-attach surface measured after the resin frame 40 was attached was 0 µm, which was small, and stable adsorption force was obtained in the die bonder, the wire bonder, and the light transmitting member mounter. Warp of the surface of the solid state imaging device 10 measured after the solid state imaging device 10 was adhered to the imaging device package 50 was +20 µm, and warp of the surface of the solid state imaging device 10 measured after the light transmitting member 30 was attached to the resin frame 40 was +20 µm, that is, each warp was sufficiently small. Further, warp of the surface of the solid state imaging device 10 was +40 µm when the temperature of the imaging device module was decreased to −40 degrees Celsius, and the warp was 0 µm when the temperature was increased to 60 degrees Celsius, that is, each warp was small. However, the change amount of warp increased.

Example 5

Next, Example 5 will be described focusing on features different from Example 1. In Example 5, the adhesive agent 502 that fixes the solid state imaging device 10 to the printed board 20 was changed from a silicone resin to an epoxy resin without rubber elasticity. At this time, warp of the die-attach surface measured after the resin frame 40 was attached was −10 µm, which was small, and stable adsorption force was obtained in the die bonder, the wire bonder, and the light transmitting member mounter. Warp of the surface of the solid state imaging device 10 measured after the solid state imaging device 10 was adhered to the imaging device package 50 was +20 µm, and warp of the surface of the solid state imaging device 10 measured after the light transmitting member 30 was attached to the resin frame 40 was +20 µm, that is, each warp was sufficiently small. Further, warp of the surface of the solid state imaging device 10 was +30 µm when the temperature of the imaging device module 50 was decreased to −40 degrees Celsius, and the warp was +10 µm when the temperature was increased to 60 degrees Celsius, that is, each warp was small. However, the maximum warp increased.

Example 6

Next, Example 6 will be described focusing on features different from Example 2. In Example 6, as with Example 5, the adhesive agent 502 that fixes the solid state imaging device 10 to the printed board 20 was changed from a silicone resin to an epoxy resin. At this time, warp of the die-attach surface measured after the resin frame 40 was attached was 0 µm, which was small, and stable adsorption force was obtained in the die bonder, the wire bonder, and the light transmitting member mounter. Warp of the surface of the solid state imaging device 10 measured after the solid state imaging device 10 was adhered to the imaging device package 50 was +30 μm, and warp of the surface of the solid state imaging device 10 measured after the light transmitting member 30 was attached to the resin frame 40 was +30 μm, that is, the warp was sufficiently small. Further, warp of the surface of the solid state imaging device 10 was +40 μm when the temperature of the imaging device module was decreased to −40 degrees Celsius, and the warp was +20 μm when the temperature was increased to 60 degrees Celsius, that is, each warp was small. However, the maximum warp increased.

Comparative Example 1

Comparative Example 1 will be described focusing on features different from Example 1. In Comparative Example 1, the type of the prepreg used for the printed board 20 was different from Example 1. In the complete printed board 20, the glass transition temperature Tgp was 250 degrees Celsius, the linear expansion coefficient αPCB1 at a temperature below the glass transition temperature Tgp was 5 ppm/degree Celsius, and the linear expansion coefficient αPCB2 at a temperature above the glass transition temperature Tgp was 10 ppm/degree Celsius. At this time, warp of the die-attach surface measured after the resin frame 40 was attached was −100 μm, which was large, adsorption force in the die bonder, the wire bonder, and the light transmitting member mounter was insufficient, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was −90 μm, and warp of the surface of the solid state imaging device 10 measured after the light transmitting member 30 was attached to the resin frame 40 was −90 μm, that is, the warp was large and did not satisfy the accuracy required for a camera. Further, warp of the surface of the solid state imaging device 10 was −150 μm when the temperature of the imaging device module was decreased to −40 degrees Celsius, the warp was −30 μm when the temperature was increased to 60 degrees Celsius, and thus the stability required for a camera was also not obtained.

Comparative Example 2

Comparative Example 2 will be described focusing on features different from Example 1. In Comparative Example 2, the type of the prepreg used for the printed board 20 was changed. In the complete printed board 20, the glass transition temperature Tgp was 160 degrees Celsius, the linear expansion coefficient αPCB1 at a temperature below the glass transition temperature Tgp was 16 ppm/degree Celsius, and the linear expansion coefficient αPCB2 at a temperature above the glass transition temperature Tgp was 36 ppm/degree Celsius. At this time, warp of the die-attach surface measured after the resin frame 40 was attached was +110 μm, which was large, adsorption force in the die bonder, the wire bonder, and the light transmitting member mounter was insufficient, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was +115 μm, and warp of the surface of the solid state imaging device 10 measured after the light transmitting member 30 was attached to the resin frame 40 was +115 μm, that is, the warp was large and did not satisfy the accuracy required for a camera. Further, warp of the surface of the solid state imaging device 10 was +130 μm when the temperature of the imaging device module 50 was decreased to −40 degrees Celsius, the warp was +80 μm when the temperature was increased to 60 degrees Celsius, and thus the stability required for a camera was not obtained.

Comparative Example 3

Comparative Example 3 will be described focusing on features different from Comparative Example 1. In Comparative Example 3, the light transmitting member 30 was changed from a quartz to a borosilicate glass. The linear expansion coefficient αL of the borosilicate glass was 7 ppm/degree Celsius. At this time, warp of the die-attach surface measured after the resin frame 40 was attached was −100 μm, which was large, adsorption force in the die bonder, the wire bonder, and the light transmitting member mounter was insufficient, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was −90 μm, and warp of the surface of the solid state imaging device 10 measured after the light transmitting member 30 was attached to the resin frame 40 was −90 μm, that is, the warp was large and did not satisfy the accuracy required for a camera. Further, warp of the surface of the solid state imaging device 10 was −140 μm when the temperature of the imaging device module 50 was decreased to −40 degrees Celsius, the warp was −40 μm when the temperature was increased to 60 degrees Celsius, and thus the stability required for a camera was not obtained.

Comparative Example 4

Comparative Example 4 will be described focusing on features different from Comparative Example 2. In Comparative Example 4, the light transmitting member 30 was changed from a quartz to a borosilicate glass. The linear expansion coefficient αL of the borosilicate glass was 7 ppm/degree Celsius. At this time, warp of the die-attach surface measured after the resin frame 40 was attached was +110 μm, which was large, adsorption force in the die bonder, the wire bonder, and the light transmitting member mounter was insufficient, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was +115 μm, and warp of the surface of the solid state imaging device 10 measured after the light transmitting member 30 was attached to the resin frame 40 was +115 μm, that is, the warp was large and did not satisfy the accuracy required for a camera. Further, warp of the surface of the solid state imaging device 10 was +140 μm when the temperature of the solid state imaging device module 50 was decreased to −40 degrees Celsius, the warp was +70 μm when the temperature was increased to 60 degrees Celsius, and thus the stability required for a camera was not obtained.

Comparative Example 5

Comparative Example 5 will be described focusing on features different from Comparative Example 1. In Comparative Example 5, the adhesive agent 502 that fixes the solid state imaging device 10 to the imaging device module was changed from a silicone resin to an epoxy resin. At this time, warp of the die-attach surface measured after the resin frame 40 was attached was −100 μm, which was large, adsorption force in the die bonder, the wire bonder, and the light transmitting member mounter was insufficient, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was −80 μm, and warp of the surface of the solid state imaging device 10 measured after the light transmitting member 30 was attached to the resin frame 40 was −80 μm, that is, the warp was large and did not satisfy the accuracy required for a camera. Further, warp of the surface of the solid state imaging device 10 was −140 μm when the temperature of the imaging device module 50 was decreased to −40 degrees Celsius, the warp was −20 μm when the temperature was increased to 60 degrees Celsius, and thus the stability required for a camera was not obtained.

Comparative Example 6

Comparative Example 6 will be described focusing on features different from Comparative Example 2. In Comparative Example 6, the adhesive agent 502 that fixes the solid state imaging device 10 to the imaging device module 50 was changed from a silicone resin to an epoxy resin. At this time, warp of the die-attach surface measured after the resin frame 40 was attached was +110 μm, which was large, adsorption force in the die bonder, the wire bonder, and the light transmitting member mounter was insufficient, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was +125 μm, and warp of the surface of the solid state imaging device 10 measured after the light transmitting member 30 was attached to the resin frame 40 was +125 μm, that is, the warp was large and did not satisfy the accuracy required for a camera. Further, warp of the surface of the solid state imaging device 10 was +140 μm when the temperature of the solid state imaging device module 50 was decreased to −40 degrees Celsius, the warp was +90 μm when the temperature was increased to 60 degrees Celsius, and thus the stability required for a camera was not obtained.

Example 7

Example 7 will be described focusing on features different from Example 1. In Example 7, the type of the prepreg used for the printed board 20 was different. In the complete printed board 20, the glass transition temperature Tgp was 190 degrees Celsius, the linear expansion coefficient αPCB1 at a temperature below the glass transition temperature Tgp was 12 ppm/degree Celsius, and the linear expansion coefficient αPCB2 at a temperature above the glass transition temperature Tgp was 28 ppm/degree Celsius. Further, the resin frame 40 was separately formed by molding. The formed resin frame 40 was adhered to the printed board 20 via the adhesive agent 501. An epoxy based resin was selected for the resin frame 40, and injection molding was used for molding. The glass transition temperature Tgf was 220 degrees Celsius, the linear expansion coefficient αf1 of the resin frame 40 at a temperature below the glass transition temperature Tgf was 13 ppm/degree Celsius, and the linear expansion coefficient αf2 of the resin frame 40 at a temperature above the glass transition temperature Tgf was 26 ppm/degree Celsius.

The process of bonding the resin frame 40 to the printed board 20 is as described in FIG. 6A and FIG. 6B. The printed board 20 was fixed on the mounter, and the adhesive agent 501 was applied to the circumference of the inner surface 202 of the printed board 20 with a dispenser. A thermosetting epoxy resin was used as the adhesive agent 501. The resin frame 40 was then mounted on the adhesive agent 501 by the mounter. At that time, the application amount of the resin was adjusted such that a part of the adhesive agent 501 was diffused up to the inner edge 403 of the resin frame 40 and diffused down to the outer edge 205 of the printed board 20. Next, the adhesive agent 501 was cured by being directly put into the oven at 200 degrees of Celsius. At this time, warp of the die-attach surface measured after the resin frame 40 was attached was −15 μm, which was small, and sufficient adsorption force was obtained in the die bonder, the wire bonder, and the light transmitting member mounter. Warp of the surface of the solid state imaging device 10 measured after the solid state imaging device 10 was adhered to the imaging device package 50 was +15 μm, and warp of the surface of the solid state imaging device 10 measured after the light transmitting member 30 was attached to the resin frame 40 was +5 μm, that is, the warp was sufficiently small. Further, warp of the surface of the solid state imaging device 10 in the imaging device module 50 was +15 μm at −40 degrees Celsius, and the warp was −5 μm at 60 degrees Celsius, that is, each warp was small.

Example 8

Example 8 will be described focusing on features different from Example 7. In Example 8, the type of the prepreg used for the printed board 20 was different. In the complete printed board 20, the glass transition temperature Tgp was 160 degrees Celsius, the linear expansion coefficient αPCB1 at a temperature below the glass transition temperature Tgp was 16 ppm/degree Celsius, and the linear expansion coefficient αPCB2 at a temperature above the glass transition temperature Tgp was 36 ppm/degree Celsius. Further, the resin of the resin frame 40 and the adhesive agent 501 were changed. After the change, the glass transition temperature Tgf was 200 degrees Celsius, the linear expansion coefficient αf1 at a temperature below the glass transition temperature Tgf was 18 ppm/degree Celsius, the linear expansion coefficient αf2 at a temperature above the glass transition temperature Tgf was 39 ppm/degree Celsius, the curing temperature of the adhesive agent 501 was 170 degrees Celsius. At this time, warp of the die-attach surface measured after the resin frame 40 was attached was −5 μm, which was small, and sufficient adsorption force was obtained in the die bonder, the wire bonder, and the light transmitting member mounter. Warp of the surface of the solid state imaging device 10 measured after the solid state imaging device 10 was adhered to the imaging device package 50 was +15 μm, and warp of the surface of the solid state imaging device 10 measured after the light transmitting member 30 was attached to the resin frame 40 was +15 μm, that is, the warp was sufficiently small. Further, warp of the surface of the solid state imaging device 10 in the imaging device module 50 was +35 µm at −40 degrees Celsius, and the warp was +5 µm at 60 degrees Celsius, that is, each warp was small.

Example 9

Example 9 will be described focusing on features different from Example 7. In Example 9, the light transmitting member 30 was changed from a quartz to a borosilicate glass. The linear expansion coefficient αL of the borosilicate glass was 7 ppm/degree Celsius. At this time, warp of the die-attach surface measured after the resin frame 40 was attached was 15 µm, which was small, and sufficient adsorption force was obtained in the die bonder, the wire bonder, and the light transmitting member mounter. Warp of the surface of the solid state imaging device 10 measured after the solid state imaging device 10 was adhered to the imaging device package 50 was +5 µm, and warp of the surface of the solid state imaging device 10 measured after the light transmitting member 30 was attached to the resin frame 40 was +5 µm, that is, the warp was sufficiently small. Further, warp of the surface of the solid state imaging device 10 in the imaging device module 50 was +35 µm at −40 degrees Celsius, and the warp was −15 µm at 60 degrees Celsius, that is, each warp was small. However, the change amount of warp increased.

Example 10

Example 10 will be described focusing on features different from Example 8. In Example 10, the light transmitting member 30 was changed from a quartz to a borosilicate glass. The linear expansion coefficient αL of the borosilicate glass was 7 ppm/degree Celsius. At this time, warp of the die-attach surface measured after the resin frame 40 was attached was −5 µm, which was small, and sufficient adsorption force was obtained in the die bonder, the wire bonder, and the light transmitting member mounter. Warp of the surface of the solid state imaging device 10 measured after the solid state imaging device 10 was adhered to the imaging device package 50 was +15 µm, and warp of the surface of the solid state imaging device measured after the light transmitting member 30 was attached to the resin frame 40 was +15 µm, that is, the warp was sufficiently small. Further, warp of the solid state imaging device in the imaging device module 50 was +45 µmm at −40 degrees Celsius, and the warp was −5 µm at 60 degrees Celsius, that is, each warp was small. However, the change amount of warp increased.

Example 11

Example 11 will be described focusing on features different from Example 7. In Example 11, the adhesive agent 502 that fixes the solid state imaging device 10 to the imaging device module 50 was changed from a silicone resin to an epoxy resin. At this time, warp of the die-attach surface measured after the resin frame 40 was attached was −15 µm, which was small, and sufficient adsorption force was obtained in the die bonder, the wire bonder, and the light transmitting member mounter. Warp of the surface of the solid state imaging device 10 measured after the solid state imaging device 10 was adhered to the imaging device package 50 was +15 µm, and warp of the surface of the solid state imaging device 10 measured after the light transmitting member 30 was attached to the resin frame 40 was +15 µm, that is, the warp was sufficiently small. Further, warp of the surface of the solid state imaging device 10 in the imaging device module 50 was +25 µm at −40 degrees Celsius, and the warp was −5 µm at 60 degrees Celsius, that is, each warp was small. However, the maximum warp increased.

Example 12

Example 12 will be described focusing on features different from Example 8. In Example 12, the adhesive agent 502 that fixes the solid state imaging device 10 to the imaging device module 50 was changed from a silicone resin to an epoxy resin. At this time, warp of the die-attach surface measured after the resin frame 40 was attached was −5 µm, which was small, and sufficient adsorption force was obtained in the die bonder, the wire bonder, and the light transmitting member mounter. Warp of the surface of the solid state imaging device 10 measured after the solid state imaging device 10 was adhered to the imaging device package was +25 µm, and warp of the surface of the solid state imaging device 10 measured after the light transmitting member 30 was attached to the resin frame 40 was +25 µm, that is, the warp was sufficiently small. Further, warp of the surface of the solid state imaging device 10 in the imaging device module 50 was +45 µm at −40 degrees Celsius, and the warp was +15 µm at 60 degrees Celsius, that is, each warp was small. However, the maximum warp increased.

Comparative Example 7

Comparative Example 7 will be described focusing on features different from Example 7. In Comparative Example 7, the type of resin used for the resin frame 40 is different. In the complete resin frame 40, the glass transition temperature Tgf was 250 degrees Celsius, the linear expansion coefficient αf1 at a temperature below the glass transition temperature Tgf was 9 ppm/degree Celsius, and the linear expansion coefficient αf2 at a temperature above the glass transition temperature Tgf was 30 ppm/degree Celsius. At this time, warp of the die-attach surface measured after the resin frame 40 was attached was +105 µm and −105 µm on the back surface, that is, the warp was large, sufficient adsorption force was not obtained in the die bonder, the wire bonder, and the light transmitting member mounter, and thus reduction in yield and reduction in a working rate of the apparatus due to occurrence of a failure in positioning accuracy was significant. Warp of the surface of the solid state imaging device 10 measured after the solid state imaging device 10 was adhered to the imaging device package 50 was +115 µm, and warp of the surface of the solid state imaging device 10 measured after the light transmitting member 30 was attached to the resin frame 40 was +115 µm, that is, the warp was large and did not satisfy the accuracy required for a camera. Further, warp of the surface of the solid state imaging device 10 in the imaging device module 50 was +160 µm at −40 degrees Celsius, the warp was +40 µm at 60 degrees Celsius, and thus the stability required for a camera was not obtained.

Comparative Example 8

Comparative Example 8 will be described focusing on features different from Example 8. In Comparative Example 8, the type of resin used for the resin frame 40 is different. In the complete resin frame 40, the glass transition temperature Tgf was 180 degrees Celsius, the linear expansion coefficient αf1 at a temperature below the glass transition temperature Tgf was 20 ppm/degree Celsius, and the linear expansion coefficient αf2 at a temperature above the glass transition temperature Tgf was 40 ppm/degree Celsius. At this time, warp of the die-attach surface measured after the resin frame 40 was attached was −120 μm, which was large, sufficient adsorption force was not obtained in the die bonder, the wire bonder, and the light transmitting member mounter, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was −105 μm, and warp of the surface of the solid state imaging device 10 measured after the light transmitting member 30 was attached to the resin frame 40 was −105 μm, that is, the warp was large and did not satisfy the accuracy required for a camera. Further, warp of the surface of the solid state imaging device 10 in the imaging device module 50 was +170 μm at −40 degrees Celsius, the warp was −95 μm at 60 degrees Celsius, and thus the stability required for a camera was not obtained.

Comparative Example 9

Comparative Example 9 will be described focusing on features different from Comparative Example 7. In Comparative Example 9, the light transmitting member 30 was changed from a quartz to a borosilicate glass. The linear expansion coefficient αL of the borosilicate glass was 7 ppm/degree Celsius. At this time, warp of the die-attach surface measured after the resin frame 40 was attached was +105 μm, which was large, sufficient adsorption force was not obtained in the die bonder, the wire bonder, and the light transmitting member mounter, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was +115 μm, and warp of the surface of the solid state imaging device 10 measured after the light transmitting member 30 was attached to the resin frame 40 was +115 μm, that is, the warp was large and did not satisfy the accuracy required for a camera. Further, warp of the surface of the solid state imaging device 10 in the solid state imaging device module was +170 μm at −40 degrees Celsius, the warp was +30 μm at 60 degrees Celsius, and thus the stability required for a camera was not obtained.

Comparative Example 10

Comparative Example 10 will be described focusing on features different from Comparative Example 8. In Comparative Example 10, the light transmitting member 30 was changed from a quartz to a borosilicate glass. The linear expansion coefficient αL of the borosilicate glass was 7 ppm/degree Celsius. At this time, warp of the die-attach surface measured after the resin frame 40 was attached was −120 μm, which was large, sufficient adsorption force was not obtained in the die bonder, the wire bonder, and the light transmitting member mounter, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was −105 μm, and warp of the surface of the solid state imaging device 10 measured after the light transmitting member 30 was attached to the resin frame 40 was −105 μm, that is, the warp was large and did not satisfy the accuracy required for a camera. Further, warp of the surface of the solid state imaging device 10 in the imaging device module 50 was −190 μm at −40 degrees Celsius, and the warp was −105 μm at 60 degrees Celsius, and thus the stability required for a camera was not obtained.

Comparative Example 11

Comparative Example 11 will be described focusing on features different from Comparative Example 7. In Comparative Example 11, the adhesive agent 502 that fixes the solid state imaging device 10 to the imaging device module 50 was changed from a silicone resin to an epoxy resin. At this time, warp of the die-attach surface measured after the resin frame 40 was attached was +105 μm, which was large, sufficient adsorption force was not obtained in the die bonder, the wire bonder, and the light transmitting member mounter, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was +125 μm, and warp of the surface of the solid state imaging device 10 measured after the light transmitting member 30 was attached to the resin frame 40 was +125 μm, that is, the warp was large and did not satisfy the accuracy required for a camera. Further, warp of the surface of the solid state imaging device 10 in the imaging device module 50 was +170 μm at −40 degrees Celsius, the warp was +50 μm at 60 degrees Celsius, and thus the stability required for a camera was not obtained.

Comparative Example 12

Comparative Example 12 will be described focusing on features different from Comparative Example 8. In Comparative Example 12, the adhesive agent 502 that fixes the solid state imaging device 10 to the imaging device module 50 was changed from a silicone resin to an epoxy resin. At this time, warp of the die-attach surface measured after the resin frame 40 was attached was −120 μm, which was large, sufficient adsorption force was not obtained in the die bonder, the wire bonder, and the light transmitting member mounter, and thus reduction in yield and reduction in a working rate of the apparatus due to occurrence of a failure in positioning accuracy were significant. Warp of the surface of the solid state imaging device 10 measured after the solid state imaging device 10 was adhered to the imaging device package 50 was −95 μm, and warp of the surface of the solid state imaging device 10 measured after the light transmitting member 30 was attached to the resin frame 40 was −95 μm, that is, the warp was large and did not satisfy the accuracy required for a camera. Further, warp of the surface of the solid state imaging device 10 in the imaging device module was −160 μm at −40 degrees Celsius, the warp was −85 μm at 60 degrees Celsius, and thus the stability required for a camera was not obtained.

FIG. 14A, FIG. 14B, FIG. 15A, and FIG. 15B illustrate measurement results and determination results of Examples and Comparative Examples. FIG. 14A illustrates the relationship between the linear expansion coefficient and the glass transition temperature in Examples 1 to 6 and Comparative Examples 1 to 6, and FIG. 14B illustrates the amount of warp, the adsorption transportation determination result, the warp determination result, and the like in the above Examples and the above Comparative Examples.

Similarly, FIG. 15A illustrates the relationship between the linear expansion coefficient and the glass transition temperature in Examples 7 to 12 and Comparative Examples 7 to 12, and FIG. 15B illustrates the amount of warp, the adsorption transportation determination result, the warp determination result, and the like in the above Examples and the above Comparative Examples.

FIG. 14A, FIG. 14B, FIG. 15A, and FIG. 15B illustrate the relationship between the temperature Tgp and the temperature Tgf, the relationship between the linear expansion coefficients αPCB1 and αf1, and the relationship between values of ((Tgp−To)×αPCB1) and ((Tgf−To)×αf1+(Tgp−Tgf)×αf2), the adsorption transportation determination result, and the warp determination result of the surface of the imaging device. In view of the above, the effects and advantages of Examples 1 to 12 according to the present invention are clear.

Second Embodiment

Figure 16:
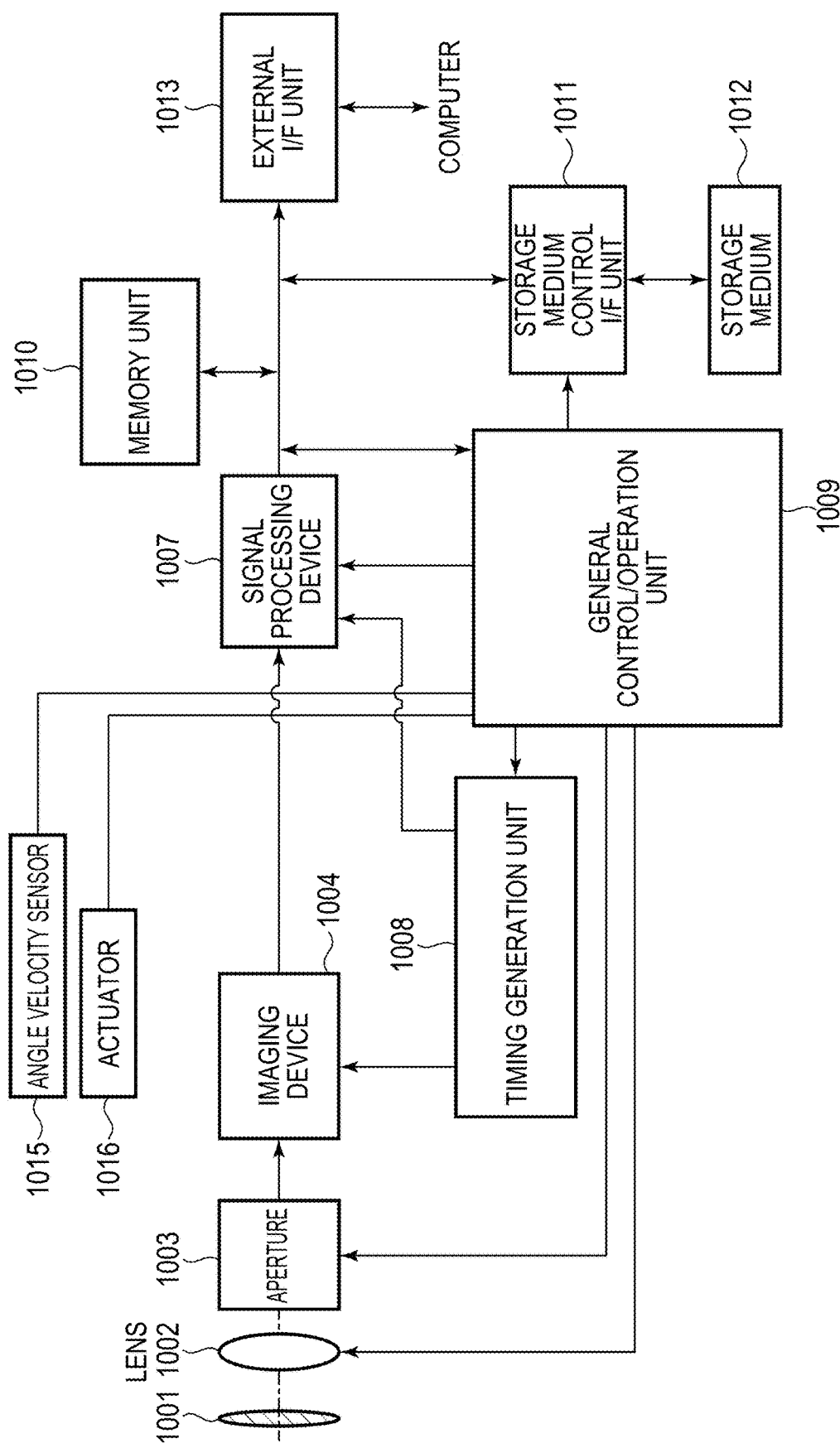
FIG. 16 is a block diagram of an imaging system according to a second embodiment.

The imaging device modules in the embodiments described above can be applied to various imaging systems. The imaging system may be, for example, a digital still camera, a digital camcorder, a camera head, a copy machine, a fax machine, a mobile phone, an on-vehicle camera, an observation satellite, a surveillance camera, or the like. FIG. 16 illustrates a block diagram of a digital still camera as an example of the imaging system.

The imaging system illustrated in FIG. 16 has a barrier 1001, a lens 1002, an aperture 1003, an imaging device 1004, a signal processing device 1007, a timing generation unit 1008, a general control/operation unit 1009, a memory unit 1010, a storage medium control I/F unit 1011, a storage medium 1012, an external I/F unit 1013, an angular velocity sensor (detection unit) 1015, and an actuator 1016. The barrier 1001 protects the lens 1002, and the lens 1002 captures an optical image of a subject onto the imaging device 1004. The aperture 1003 changes a light amount passing through the lens 1002. The imaging device 1004 is formed of the imaging device module 1 described above and converts the optical image captured by the lens 1002 into image data. The signal processing device 1007 performs various corrections and data compression on the image data output from the imaging device 1004. The timing generation unit 1008 outputs various timing signals to the imaging device 1004 and the signal processing device 1007. The general control/operation unit 1009 controls the entire digital still camera, and the memory unit 1010 temporarily stores image data. The storage medium control I/F unit 1011 is an interface that stores or reads image data on the storage medium 1012, and the storage medium 1012 is a removable storage medium such as a semiconductor memory used for storing or reading imaging data. The external I/F unit 1013 is an interface used for communicating with an external computer or the like. The timing signal or the like may be input from the outside of the imaging system, and the imaging system may have at least the imaging device 1004 and the signal processing device 1007 that processes an image signal output from the imaging device 1004.

The imaging device 1004 and an analog-to-digital (AD) conversion unit may be provided on the same semiconductor substrate, or the imaging device 1004 and the AD conversion unit may be formed on separate semiconductor substrates. Further, the imaging device 1004 and the signal processing device 1007 may be formed on the same semiconductor substrate. Each of the pixels may include a first photoelectric conversion portion and a second photoelectric conversion portion. The signal processing unit 1007 may be configured to process a pixel signal generated in the first photoelectric conversion portion and a pixel signal generated in the second photoelectric conversion portion and acquire information based on a distance between the imaging device 1004 and the subject.

The angular velocity sensor 1015 is fixed to a casing of the imaging system or the like and detects a camera shake of the imaging system. The camera shake is detected as respective amounts of displacement in the X-direction and the Y-direction on the light receiving surface of the imaging device. The actuator 1016 is formed of an electromagnetic drive mechanism, a piezo drive mechanism, or the like and displaces the position of the imaging device 1004. The actuator 1016 is controlled by the general control/operation unit 1009 and drives the imaging device 1004 in the direction in which the amount of displacement detected by the angular velocity sensor 1015 is counteracted.

Figure 17A:
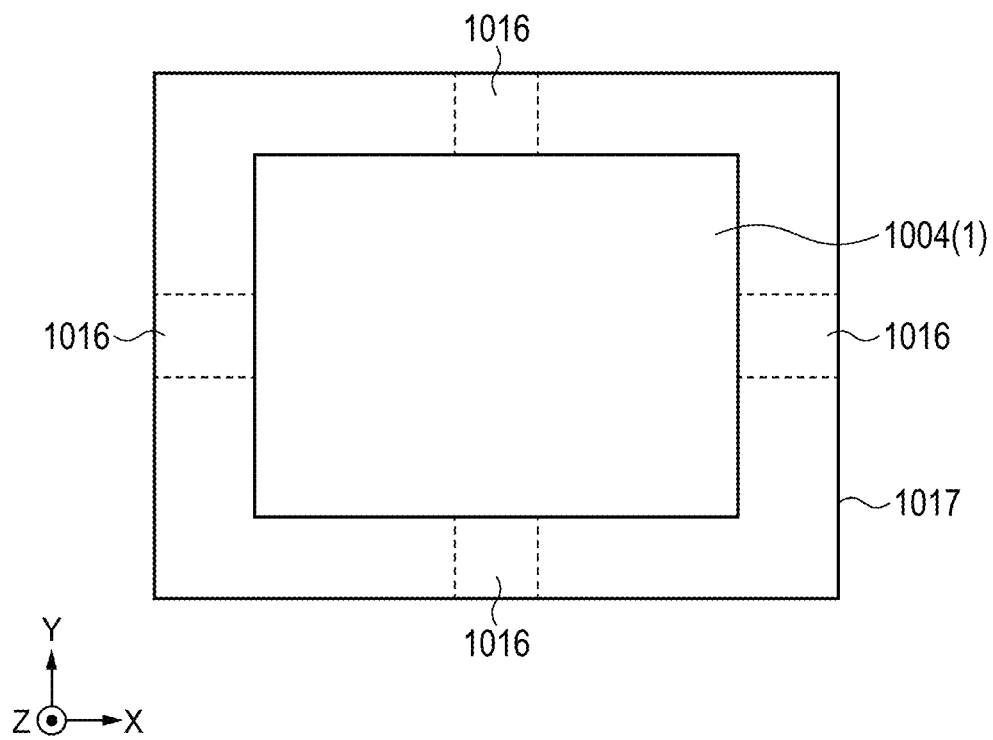
FIG. 17A and FIG. 17B are diagrams illustrating the imaging system according to the second embodiment.
Figure 17B:
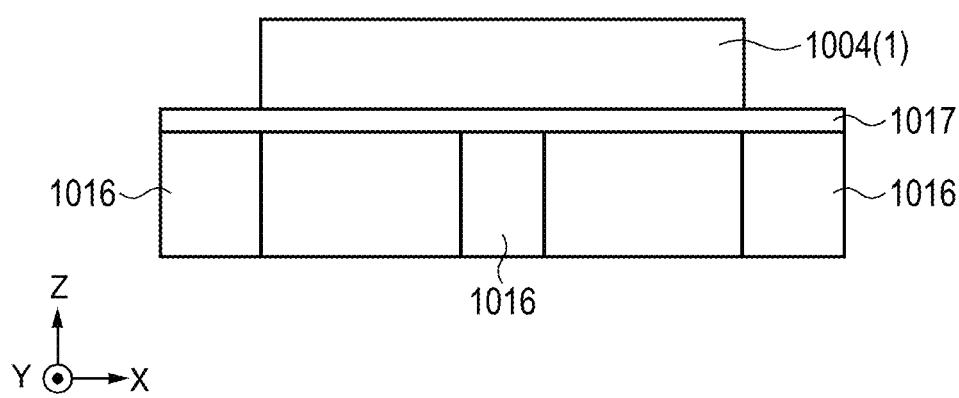

FIG. 17A and FIG. 17B are diagrams illustrating the imaging device 1004 in the present embodiment. FIG. 17A is a plan view of the imaging device 1004, and FIG. 17B is a side view of the imaging device 1004. The imaging device 1004 is attached to the upper surface of a substrate 1017, and the actuator 1016 is provided on the lower surface of the substrate 1017. The actuator 1016 can move the imaging device 1004 in the X-direction and the Y-direction.

The imaging device 1004 in the present embodiment is formed of the imaging device module 1 in the first embodiment. In the imaging device module 1, an electronic device such as the solid state imaging device 10 is directly attached to the printed board 20 without using a ceramic package. Thus, the imaging device 1004 can be reduced in weight, and a camera shake correction mechanism by a sensor shift scheme that controls displacement of the imaging device 1004 can be adopted.

Third Embodiment

Figure 18A:
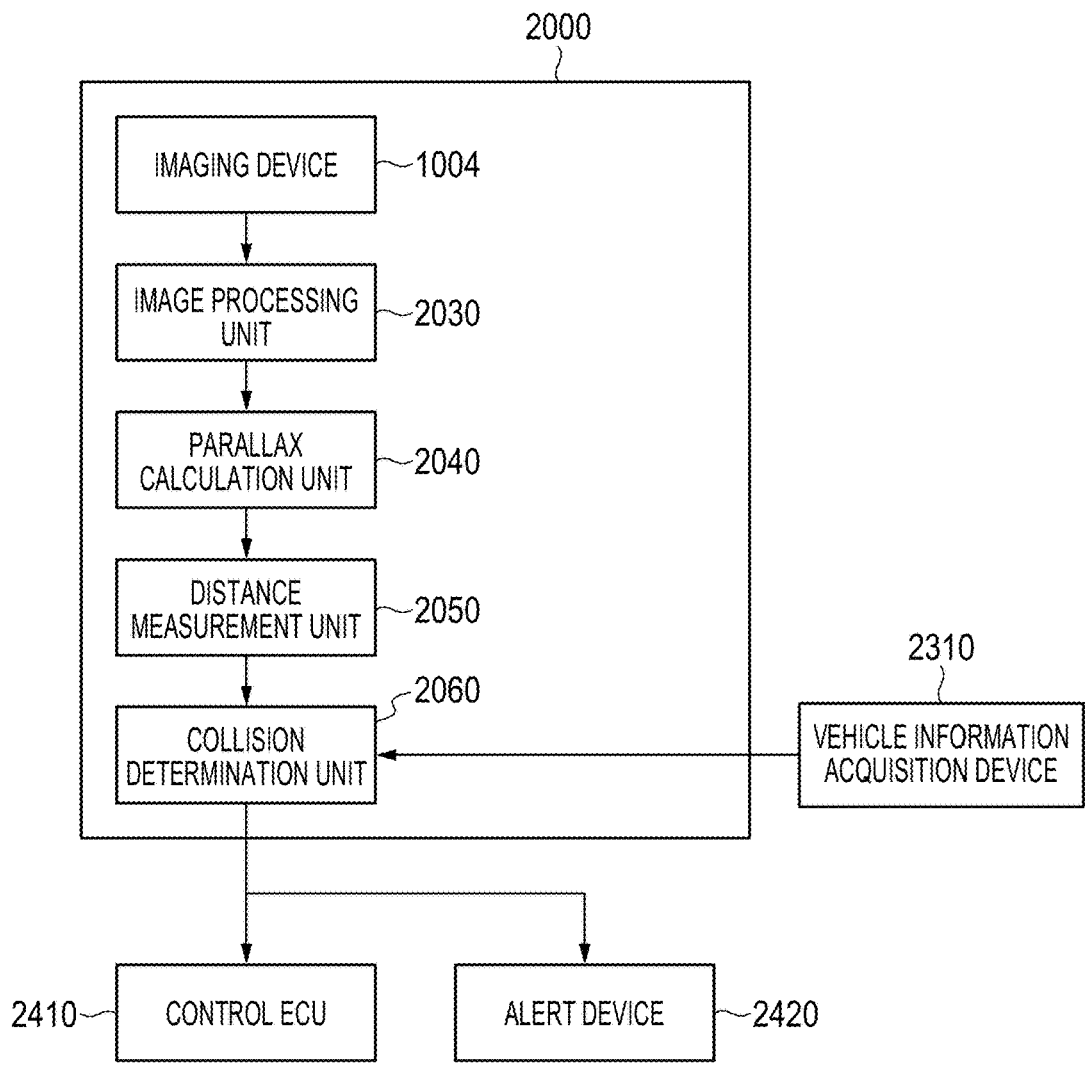
FIG. 18A is a block diagram of an imaging system related to an on-vehicle camera in a third embodiment.
Figure 18B:
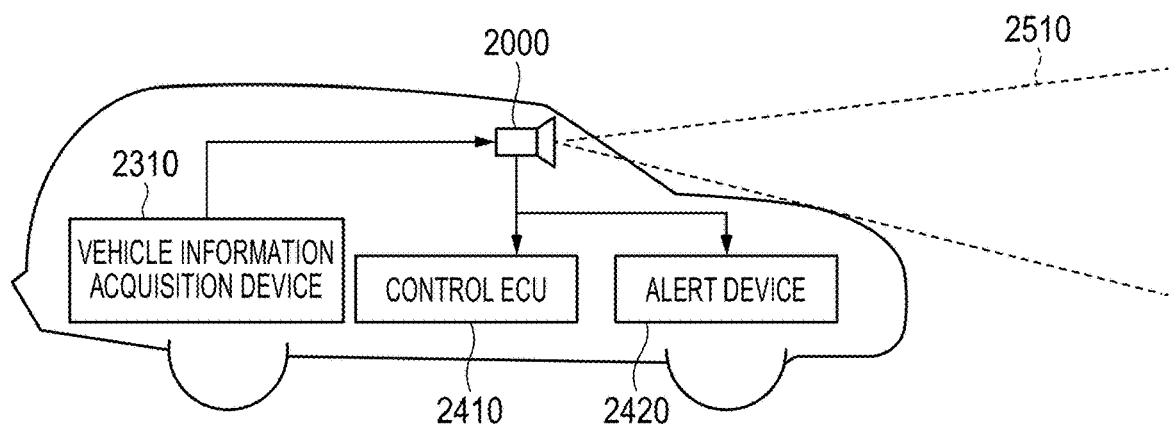
FIG. 18B is a block diagram of the imaging system related to the on-vehicle camera in the third embodiment.

FIG. 18A and FIG. 18B are block diagrams of the imaging system related to an on-vehicle camera in the present embodiment. An imaging system 2000 has the imaging device 1004 in the embodiments described above. The imaging system 2000 has an image processing unit 2030 that performs image processing on a plurality of image data acquired by the imaging device 1004 and a parallax calculation unit 2040 that calculates a parallax (a phase difference of parallax images) from the plurality of image data acquired by the imaging system 2000. Further, the imaging system 2000 has a distance measurement unit 2050 that calculates a distance to the object based on the calculated parallax and a collision determination unit 2060 that determines whether or not there is a collision possibility based on the calculated distance. Here, the parallax calculation unit 2040 and the distance measurement unit 2050 are an example of a distance information acquisition unit that acquires distance information on the distance to the object. That is, the distance information is information on a parallax, a defocus amount, a distance to an object, or the like. The collision determination unit 2060 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 2000 is connected to the vehicle information acquisition device 2310 and can acquire vehicle information such as a vehicle speed, a yaw rate, a steering angle, or the like. Further, the imaging system 2000 is connected to a control ECU 2410, which is a control device that outputs a control signal for causing a vehicle to generate braking force based on a determination result by the collision determination unit 2060. Further, the imaging system 2000 is also connected to an alert device 2420 that issues an alert to the driver based on a determination result by the collision determination unit 2060. For example, when the collision probability is high as the determination result of the collision determination unit 2060, the control ECU 2410 performs vehicle control to avoid a collision or reduce damage by applying a brake, pushing back an accelerator, suppressing engine power, or the like. The alert device 2420 alerts a user by sounding an alert such as a sound, displaying alert information on a display of a car navigation system or the like, providing vibration to a seat belt or a steering wheel, or the like. The imaging system 2000 functions as a control unit that controls an operation of controlling the vehicle as described above.

In the present embodiment, an area around a vehicle, for example, a front area or a rear area is captured by using the imaging system 2000. FIG. 18B illustrates the imaging system when a front area of a vehicle (a capturing area 2510) is captured. The vehicle information acquisition device 2310 as an image capturing control unit transmits instructions to the imaging system 2000 or the imaging device 1004 to perform the operations described in the first and second embodiments described above. Such a configuration can further improve the ranging accuracy.

Although the example of control for avoiding a collision to another vehicle has been described in the above description, the embodiment is applicable to automatic driving control for following another vehicle, automatic driving control for not going out of a traffic lane, or the like. Furthermore, the imaging system is not limited to a vehicle such as the subject vehicle, and can be applied to a moving unit (moving apparatus) such as a ship, an airplane, or an industrial robot, for example. In addition, the imaging system can be widely applied to any device which utilizes object recognition, such as an intelligent transportation system (ITS), without being limited to moving units.

Other Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention. Further, the present invention can also be applied to electronic devices other than the solid state imaging device.

Note that each of the embodiments described above merely illustrates an embodied example in implementing the present invention, and the technical scope of the present invention is not to be construed in a limiting sense by these embodiments. That is, the present invention can be implemented in various forms without departing from the technical concept thereof or the primary features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-086514, filed Apr. 27, 2018, which is hereby incorporated by reference herein in its entirety.

What is claimed is:

1. An imaging device module comprising:
   a substrate having a first primary surface, a second primary surface, and an outer edge continuous to the first primary surface and the second primary surface and including a plurality of conductor layers and a plurality of insulating layers;
   a solid state imaging device attached to the first primary surface;
   a frame attached to the first primary surface so as to surround a circumference of the solid state imaging device; and
   a light transmitting member fixed on the frame,
   wherein a relationship of $$Tgp > Tgf,$$

$$\alpha f1 < \alpha PCB1, \text{ and}$$

$$(Tgp-To) \times \alpha PCB1 < (Tgf-To) \times \alpha f1 + (Tgp-Tgf) \times \alpha f2$$

or a relationship of $$Tgp < Tgf,$$

$$\alpha PCB1 < \alpha f1, \text{ and}$$

$$(Tgf-To) \times \alpha f1 < (Tgp-To) \times \alpha PCB1 + (Tgf-Tgp) \times \alpha PCB2$$

is satisfied, wherein a linear expansion coefficient in an in-plane direction of the substrate at a temperature below a glass transition temperature Tgp of the substrate is denoted as $\alpha PCB1$, a linear expansion coefficient in the in-plane direction of the substrate at a temperature above the glass transition temperature Tgp is denoted as $\alpha PCB2$, a linear expansion coefficient of the frame at a temperature below a glass transition temperature Tgf of the frame is denoted as $\alpha f1$, a linear expansion coefficient of the frame at a temperature above the glass transition temperature Tgf is denoted as $\alpha f2$, and a room temperature is denoted as To.

2. The imaging device module according to claim 1, wherein the glass transition temperature Tgp is higher than the glass transition temperature Tgf, and the frame is molded on the substrate.

3. The imaging device module according to claim 1, wherein the linear expansion coefficient $\alpha PCB1$ and the linear expansion coefficient $\alpha f1$ are smaller than a linear expansion coefficient $\alpha L$ in an in-plane direction of the light transmitting member and larger than a linear expansion coefficient $\alpha c$ in an in-plane direction of the solid state imaging device.

4. The imaging device module according to claim 1, wherein the substrate is a printed board containing a prepreg.

5. The imaging device module according to claim 1, wherein the frame contains a resin.

6. The imaging device module according to claim 1, wherein the solid state imaging device is attached by an adhesive agent to the first primary surface.

7. The imaging device module according to claim 6, wherein the adhesive agent is a resin having rubber elasticity.

8. The imaging device module according to claim 1, wherein the frame covers the outer edge of the substrate.

9. The imaging device module according to claim 1, wherein the frame does not cover the outer edge of the substrate.

10. An imaging system comprising a signal processing device that processes pixel signals output from the solid state imaging device according to claim 1.

11. The imaging system according to claim 10, further comprising:
a detection unit that detects motion of the imaging system; and
an actuator that displaces the imaging device module based on a signal from the detection unit.

12. The imaging system according to claim 10,
wherein the solid state imaging device comprises a plurality of pixels,
wherein each of the pixels has a plurality of photoelectric conversion portions, and
wherein the signal processing device processes the pixel signals generated by the plurality of photoelectric conversion portions, respectively, and acquires information based on a distance from the solid state imaging device to a subject.

13. An imaging device package comprising:
a substrate having a first primary surface, a second primary surface, and an outer edge continuous to the first primary surface and the second primary surface and including a plurality of conductor layers and a plurality of insulating layers; and
a frame attached to the first primary surface,
wherein a relationship of $Tgp > Tgf,$ $\alpha f1 < \alpha PCB1$, and $(Tgp-To) \times \alpha PCB1 < (Tgf-To) \times \alpha f1 + (Tgp-Tgf) \times \alpha f2$ or a relationship of $Tgp < Tgf,$ $\alpha PCB1 < \alpha f1$, and $(Tgf-To) \times \alpha f1 < (Tgp-To) \times \alpha PCB1 + (Tgf-Tgp) \times \alpha PCB2$ is satisfied, wherein a linear expansion coefficient in an in-plane direction of the substrate at a temperature below a glass transition temperature Tgp of the substrate is denoted as $\alpha PCB1$, a linear expansion coefficient in the in-plane direction of the substrate at a temperature above the Tgp is denoted as $\alpha PCB2$, a linear expansion coefficient of the frame at a temperature below a glass transition temperature Tgf of the frame is denoted as $\alpha f1$, a linear expansion coefficient of the frame at a temperature above the Tgf is denoted as $\alpha f2$, and a room temperature is denoted as To.

14. A manufacturing method of an imaging device module, the manufacturing method comprising steps of:
preparing a substrate having a first primary surface, a second primary surface, and an outer edge continuous to the first primary surface and the second primary surface and including a plurality of conductor layers and a plurality of insulating layers;
attaching a solid state imaging device to the first primary surface;
attaching a frame to the first primary surface so as to surround a circumference of the solid state imaging device; and
attaching a light transmitting member on the frame,
wherein a relationship of $Tgp > Tgf,$ $\alpha f1 < \alpha PCB1$, and $(Tgp-To) \times \alpha PCB1 < (Tgf-To) \times \alpha f1 + (Tgp-Tgf) \times \alpha f2$ or a relationship of $Tgp < Tgf,$ $\alpha PCB1 < \alpha f1$, and $(Tgf-To) \times \alpha f1 < (Tgp-To) \times \alpha PCB1 + (Tgf-Tgp) \times \alpha PCB2$ is satisfied, wherein a linear expansion coefficient in an in-plane direction of the substrate at a temperature below a glass transition temperature Tgp of the substrate is denoted as $\alpha PCB1$, a linear expansion coefficient in the in-plane direction of the substrate at a temperature above the glass transition temperature Tgp is denoted as $\alpha PCB2$, a linear expansion coefficient of the frame at a temperature below a glass transition temperature Tgf of the frame is denoted as $\alpha f1$, a linear expansion coefficient of the frame at a temperature above the glass transition temperature Tgf is denoted as $\alpha f2$, and a room temperature is denoted as To, and
wherein the step of attaching the frame to the substrate is performed at a temperature between the glass transition temperature Tgp and the glass transition temperature Tgf.

15. The manufacturing method of the imaging device module according to claim 14, wherein the glass transition temperature Tgp is higher than the glass transition temperature Tgf, and the frame is molded on the substrate at a temperature between the glass transition temperature Tgp and the glass transition temperature Tgf.

* * * * *